(12) United States Patent
Miyazaki

(10) Patent No.: US 8,853,074 B2
(45) Date of Patent: Oct. 7, 2014

(54) METHOD OF MANUFACTURING SEMICONDUCTOR DEVICE

(75) Inventor: Tatsuya Miyazaki, Tokyo (JP)

(73) Assignee: PS4 Luxco S.a.r.l., Luxembourgh (LU)

( * ) Notice: Subject to any disclaimer, the term of this patent is extended or adjusted under 35 U.S.C. 154(b) by 697 days.

(21) Appl. No.: 13/069,754

(22) Filed: Mar. 23, 2011

(65) Prior Publication Data

US 2011/0237069 A1  Sep. 29, 2011

(30) Foreign Application Priority Data

Mar. 24, 2010  (JP) .................. 2010-068179

(51) Int. Cl.
- *H01L 21/4763* (2006.01)
- *H01L 21/768* (2006.01)
- *C25D 7/12* (2006.01)

(52) U.S. Cl.
CPC .... *H01L 21/76808* (2013.01); *H01L 21/76816* (2013.01); *C25D 7/12* (2013.01); *H01L 21/76877* (2013.01)
USPC .......................................... 438/638; 438/629

(58) Field of Classification Search
USPC .................. 438/618, 622, 625, 628, 629, 638
See application file for complete search history.

(56) References Cited

U.S. PATENT DOCUMENTS

| | | | | |
|---|---|---|---|---|
| 6,165,894 A | * | 12/2000 | Pramanick et al. | 438/627 |
| 6,340,633 B1 | * | 1/2002 | Lopatin et al. | 438/625 |
| 6,964,922 B2 | * | 11/2005 | Lee et al. | 438/688 |
| 2002/0182857 A1 | * | 12/2002 | Liu et al. | 438/645 |
| 2008/0067072 A1 | * | 3/2008 | Kim et al. | 205/96 |

FOREIGN PATENT DOCUMENTS

| | | |
|---|---|---|
| JP | 2000-80496 | 3/2000 |
| JP | 2004-124262 | 4/2004 |
| JP | 2004-270028 | 9/2004 |
| JP | 2006-111896 | 4/2006 |

\* cited by examiner

*Primary Examiner* — Jae Lee
*Assistant Examiner* — Quovaunda V Jefferson

(57) ABSTRACT

A method of manufacturing a semiconductor device may include, but is not limited to the following processes. A first hole is formed in an insulating film. A seed layer, which covers an upper surface of the insulating film and an inner surface of the first hole, is formed. A first plating film is formed over the seed layer at a first growth rate. A second plating film is formed over the first plating film at a second growth rate that is higher than the first growth rate. A third plating film is formed over the second plating film at a third growth rate that is higher than the second growth rate.

18 Claims, 22 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device.

Priority is claimed on Japanese Patent Application No. 2010-068179, filed Mar. 24, 2010, the content of which is incorporated herein by reference.

2. Description of the Related Art

Regarding a method of the related art for manufacturing a semiconductor device, a groove is formed in an insulating film. Then, a seed layer is formed so as to cover an inner surface of the groove and an upper surface of the insulating film. Then, a plating film, which fills the groove, is formed over the insulating film by an electrolytic plating method. Then, unnecessary portions of the seed layer and the plating film, which are positioned higher in level than the upper surface of the insulating film, are removed by a CMP (Chemical Mechanical Polishing) method. Thus, a single-damascene wire, which is made of the plating film, is formed in the groove.

Regarding another method of a related art for manufacturing a semiconductor device, an opening, which includes a groove and a through hole, is formed in an insulating film. Then, a seed layer is formed so as to cover an inner surface of the opening. Then, a plating film, which fills the opening, is formed over the seed layer by an electrolytic plating method. Then, unnecessary portions of the seed layer and the plating film, which are positioned higher than the upper surface of the insulating film, are removed by a CMP (Chemical Mechanical Polishing) method. Thus, a dual-damascene wire, which is made of the plating film, is formed in the groove and the through hole.

Hereinafter, the above two methods of forming damascene wires are called damascene processes. In the damascene process, it is preferable that voids are not included in the plating film filling the groove and the through hole.

Japanese Patent Laid-Open Publication No. 2000-80496 discloses a method in which a plating process is carried out at a low current, for a short time, so as to form a first plating film, that fills a narrow groove and a through hole with a small diameter. Then, the plating process is carried out at a large current so as to form a second plating film that fills a through hole with a large diameter.

Japanese Patent Laid-Open Publication No. 2004-124262 discloses a method in which a low current is applied to the seed layer (preliminary energization) when part of the seed layer is etched with a plating solution, and therefore the seed layer becomes discontinuous. Then, a high current is applied to the seed layer to form a plating film that fills the groove.

Japanese Patent Laid-Open Publication No. 2006-111896 discloses a method in which a seed layer is formed so as to cover an inner surface of a through hole penetrating through a substrate. Then, a plating film, which fills only a lower portion of the through hole, is formed while a current density on the upper surface side of the substrate is smaller than that on the lower surface side of the substrate. Then, a plating film is formed so as to fill the through hole with use of a plating solution containing a plating inhibitor and a plating accelerator, while a current density on the upper surface side of the substrate is larger than that on the lower surface side of the substrate.

It is important in the damascene process to perform a polishing after the CMP process in order to prevent dishing or erosion. Japanese Patent Laid-Open Publication No. 2004-270028 discloses a method in which a current is applied only in a direction in which a plating film is grown. Then, a current is applied only in a direction opposite to the direction in which the plating film is grown. Then, a current is applied only in a direction in which the plating film is grown. Thus, protrusion of the plating film filling a minute groove can be prevented, thereby preventing dishing and erosion which occur after the CMP process.

However, according to the methods disclosed in Japanese Patent Laid-Open Publication No. 2000-80496, No. 2004-124262, and No. 2004-270028, when a groove with a wide width (in which a wire is formed) and an opening with a large area in plan view (in which a pad is formed) cannot be filled with a plating film after the second plating film formation process, a CMP process to be performed on the plating film thereafter causes dishing, erosion, or the like to occur in the plating film filling the groove and the opening.

Further, according to the method disclosed in Japanese Patent Laid-Open Publication No. 2004-124262, although voids can be prevented from being included in the seed layer, the groove is filled with the plating film formed by applying a high current to the seed layer (i.e., the plating film having the poor burying characteristics). For this reason, when the width of the groove is small, voids are included in the plating film filling the groove. Generally, voids are likely to be included in a plating film filling a groove and a through hole in which a dual damascene wire is formed.

Moreover, the method disclosed in Japanese Patent Laid-Open Publication No. 2006-111896 is applicable only to a through hole penetrating through a substrate, and therefore cannot be applied to the damascene process.

SUMMARY

In one embodiment, a method of manufacturing a semiconductor device may include, but is not limited to the following processes. A first hole is formed in an insulating film. A seed layer, which covers an upper surface of the insulating film and an inner surface of the first hole, is formed. A first plating film is formed over the seed layer at a first growth rate. A second plating film is formed over the first plating film at a second growth rate that is higher than the first growth rate. A third plating film is formed over the second plating film at a third growth rate that is higher than the second growth rate.

In another embodiment, a method of manufacturing a semiconductor device may include, but is not limited to the following processes. A first hole is formed in an insulating film. A seed layer, which covers an upper surface of the insulating film and an inner surface of the first hole, is formed. A first amount of current is applied to the seed layer to form a first plating film over the seed layer. A second amount of current is applied to the seed layer to form a second plating film over the first plating film. The second amount is larger than the first amount. A third amount of current is applied to the seed layer to form a third plating film over the second plating film. The third amount is larger than the second amount.

In still another embodiment, a method of manufacturing a semiconductor device may include, but is not limited to the following processes. A first hole is formed in an insulating film. A second hole is formed in the insulating film. The second hole is separated from the first hole. The second hole is larger in horizontal dimension than the first hole. A seed layer, which covers an upper surface of the insulating film and inner surfaces of the first and second holes, is formed. A first plating film is formed over the seed layer. A second plating film is formed over the first plating film. The second plating film fills up the first hole. The second plating film has a first portion in the second hole. The lowest level of an upper surface of the first portion is lower than the level of the upper surface of the insulating film. A third plating film is formed over the second plating film. The third plating film fills up the second hole.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 1:
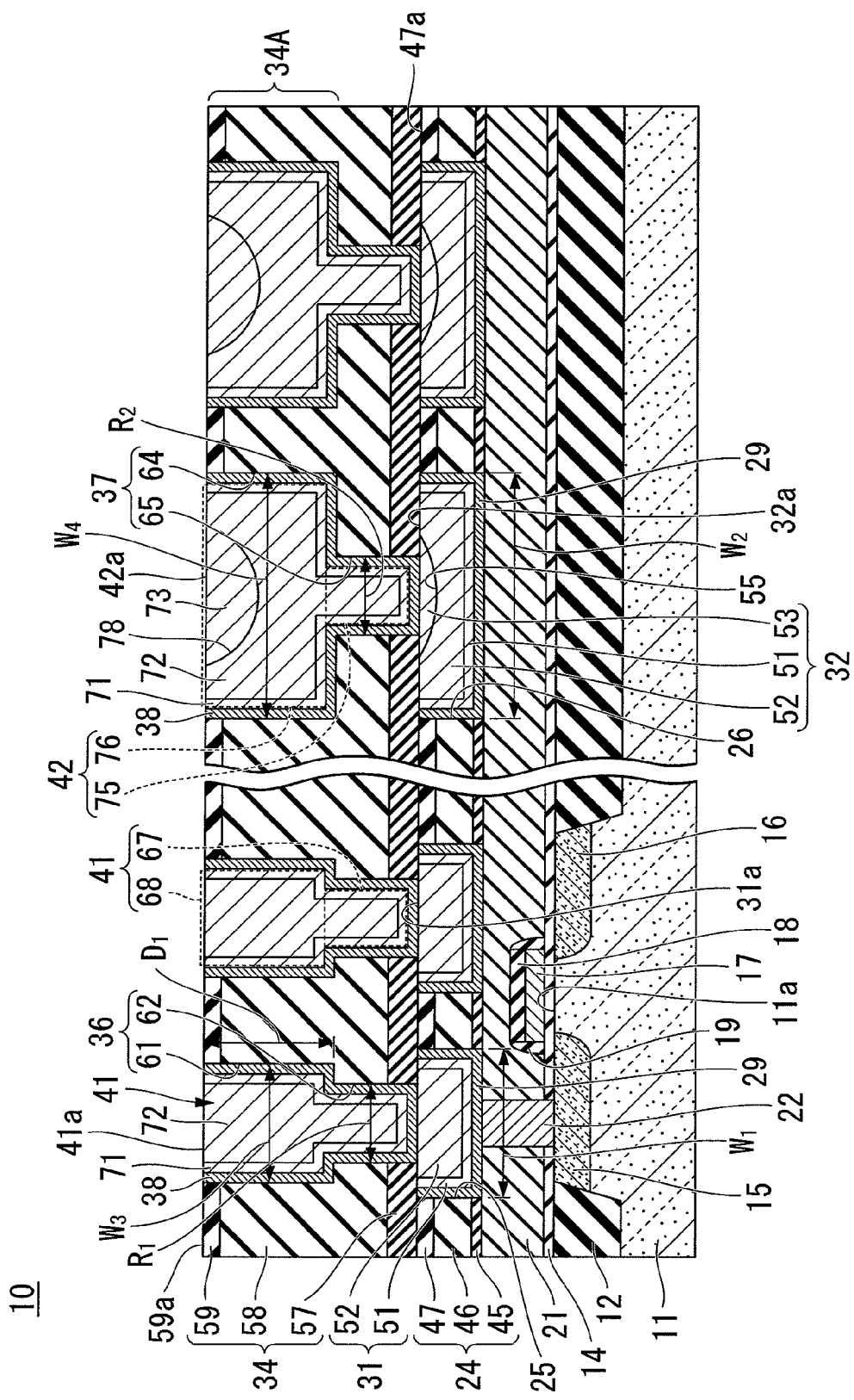
FIG. 1 is a cross-sectional view illustrating a semiconductor device according to a first embodiment of the present invention.

FIG. 1 is a cross-sectional view illustrating a semiconductor device 10 according to a first embodiment of the present invention. The semiconductor device 10 includes: a semiconductor substrate 11; a device isolation region 12; a gate insulating film 14; first and second impurity diffusion regions 15 and 16; a gate electrode 17; a silicon nitride film 18; a sidewall 19; a first inter-layer insulating film 21; a first contact plug 22; a first insulating film 24; first openings 25 and 36; second openings 26 and 37 which are different in size from the first openings 25 and 36; a first seed layer 29; first conductive portions 31 and 32; second conductive portions 41 and 42; a second insulating film 34; and a second seed layer 38.

For example, a silicon substrate may be used as the semiconductor substrate 11. The device isolation region 12 is formed in the semiconductor substrate 11. The device isolation region 12 includes an insulating film, such as a silicon oxide ($SiO_2$) film or a silicon nitride film, which fills a groove formed in the semiconductor substrate 11.

The gate insulating film 14 covers a surface 11a of the semiconductor substrate 11 and an upper surface of the device isolation region 12. For example, a silicon oxide ($SiO_2$) film may be used as the gate insulating film 14.

The first and second impurity diffusion regions 15 and 16 are formed in a surface region of the semiconductor substrate 11. Upper surfaces of the first and second impurity diffusion regions 15 and 16 (on the side of the surface 11a of the semiconductor substrate 11) are covered by the gate insulating film 14.

The gate electrode 17 covers a portion of the gate insulating film 14, which is positioned between the first and second impurity diffusion regions 15 and 16. For example, a polysilicon (Poly-Si) film or a tungsten (W) film may be used as a base material of the gate electrode 17.

The silicon nitride film 18 covers an upper surface of the gate electrode 17. The silicon nitride film 18 is used as an etching mask when the base material of the gate electrode 17 is patterned.

The sidewall 19 covers side surfaces of the gate electrode 17 and the silicon nitride film 18. For example, a silicon nitride film may be used as a base material of the sidewall 19.

The first inter-layer insulating film 21 is formed over the gate insulating film 14 so as to cover the silicon nitride film 18 and the sidewall 19. For example, a silicon oxide ($SiO_2$) film may be used as the first inter-layer insulating film 21.

The first contact plug 22 penetrates through the first inter-layer insulating film 21, and has a bottom surface contacting the first impurity diffusion region 15. For example, tungsten (W) may be used as a material of the first contact plug 22.

The first insulating film 24 includes: a diffusion prevention film 45; a low dielectric insulating film 46 over the diffusion prevention film 45; and a protection film 47 over the diffusion prevention film 45.

The diffusion prevention film 45 is formed over the first inter-layer insulting film 21. The diffusion prevention film 45 is used for preventing a metal included in plating films forming the first and second conductive portions 31 and 32 from diffusing into the underlying film (for example, the first inter-layer insulating film 21).

The diffusion prevention film 45 is also used as an etching stopper film when the low dielectric constant insulating film 46 and the protection film 47 are anisotropically-etched (in a process shown in FIG. 4 that will be explained later).

For example, a silicon carbonitride (SiCN) film may be used as the diffusion prevention film 45. In this case, the thickness of the diffusion prevention film 45 may be, for example, 30 nm.

The low dielectric constant insulating (low-k) film 46 is formed over the diffusion prevention film 45. For example, a silicon oxycarbide (SiCN) film may be used as the low dielectric constant insulating film 46. When a silicon oxycarbide (SiCN) film is used as the low dielectric constant insulating film 46, the thickness of the low dielectric constant insulating film 46 may be, for example, 110 nm.

The protection film 47 is formed over the low dielectric constant insulating film 46. The protection film 47 is used for protecting the low dielectric constant insulating film 46 with low mechanical strength. For example, a silicon oxide film (with the thickness of, for example, 180 nm) may be used as the protection film 47.

The first opening 25 is formed so as to penetrate through the first insulating film 24 over the first contact plug 22. In other words, the first opening 25 is a through hole. The first seed layer 29 is formed so to cover an inner surface of the first opening 25. The first conductive portion 31, which includes plating films, is formed over the first seed layer 29 so as to fill the first opening 25.

The first opening 25 is a through hole in which a wire with a small width (the first conductive film 31 in this case) is formed. For this reason, the horizontal width $W_1$ of the first opening 25 is small. The horizontal width $W_1$ is, for example, 50 nm to 300 nm. Since the horizontal width $W_1$ of the first opening 25 is small, the first opening 25 has a high aspect ratio (depth/width) that is greater than or equal to 1.

For this reason, a plating film with a high growth rate (third plating film 53 formed at a third growth rate which will be explained later) is formed in the first opening 25 by, for example, applying a large current (for example, 40.5 A) to the first seed layer 29. Voids are included in the plating film. In other words, the first opening 25 is a through hole where voids are likely to occur.

Generally, a plating film with a high growth rate (third plating film 53 that will be explained later) has poor burying characteristics. On the other hand, a plating film with a low growth rate (first and second plating films 51 and 52 that will be explained later) has excellent burying characteristics.

The burying characteristics indicate whether or not a groove or hole can be filled without voids occurring therein. Excellent burying characteristics indicate that a groove or hole can be filled with a plating film without voids being included in the plating film.

The second opening 26 is formed so as to penetrate through the first insulating film 24. In other words, the second opening 26 is a through hole. The depth of the second opening 26 is the same as that of the first opening 25. The first seed layer 29 is formed so as to cover an inner surface of the second opening 26. The second conductive portion 32, which includes plating films, is formed over the first seed layer 29 so as to fill the second opening 26.

The second opening 26 is a through hole in which a wire with a larger width than that of the first conductive portion 31 (i.e., the second conductive portion 32 in this case) is formed. For this reason, the width $W_2$ of the second opening 26 is larger than the width $W_1$ of the first opening 25. Therefore, to fill the second opening 26 with a plating film, a plating film with a large thickness has to be formed.

Accordingly, when the entire second opening 26 is filled with the second plating film 52 with a low growth rate that will be explained later (a plating film formed at a second growth rate that is lower than the third growth rate that will be explained later), a plating process has to be carried out for a long time. The width $W_2$ of the second opening 26 may be, for example, 50 nm to 3000 nm.

Since the width $W_2$ of the second hole 26 is large, the second opening 26 is a through hole with a small aspect ratio (depth/width) of the second opening 26. The aspect ratio of the second opening 26 is less than or equal to 1. In other words, voids are less likely to occur in the second opening 26 than in the first opening 25. For this reason, when the second opening 26 is filled with a plating film with a high growth rate (third plating film 53 that will be explained later), voids are not likely to be included in the plating film.

The first seed layer 29 is formed so as to cover bottom and side surfaces of the first and second openings 25 and 26. The first seed layer 29 is a power feeding layer when the first and second conductive portions 31 and 32 are formed. As the first seed layer 29, a multi-layered film may be used, which includes, for example, a tantalum layer (with a thickness of, for example, 20 nm) and a copper (Cu) layer (with a thickness of, for example, 50 nm) over the tantalum layer.

The first conductive portion 31 is a wire (single-damascene wire) formed by a damascene method. The first conductive portion 31 is formed over the first seed layer 29 so as to fill the first opening 25. The first conductive portion 31 has a flat upper surface 31a. The upper surface 31a of the first conductive portion 31 and an upper surface 47a of the protection film 47 (i.e., the top surface of the first insulating film 24) have the same level.

The first conductive portion 31 includes a first plating film 51 and a second plating film 52. The first plating film 51 is formed so as to cover the seed layer 29 covering the bottom and side surfaces of the first opening 25. The first plating film 51 is formed at the first growth rate by the electrolytic plating method. The first growth rate is, for example, 2.5 nm/sec to 3.2 nm/sec. The first plating film 51 has excellent burying characteristics, but the growth rate thereof is very low.

The first plating film 51 covers thin portions and discontinuous portions of the first seed layer 29, thereby preventing voids being included in the second plating film 52 to be formed over the first plating film 51 so as to fill the first opening 25.

The first plating film 51 is an underlying film for the second plating film 52 to be properly grown. For example, a copper (Cu) plating film may be used as the first plating film 51. When a copper plating film is used as the first plating film 51, the first plating film 51 is formed such that a thickness of the first plating film 51 over a large flat surface becomes 15 nm.

The second plating film 52 is formed over the first plating film 51 so as to fill the first opening 25. The thickness of the second plating film 52 is such that the first opening 25, the width of which is smaller than that of the second opening 26, is filled with the second plating film 52.

The second plating film 52 is formed by the electrolytic plating method at the second growth rate that is higher than the first growth rate and is lower than the third growth rate. The second growth rate is, for example, 3.4 nm/sec to 4.5 nm/sec. The second plating film 52 has more excellent burying characteristics than that of the third plating film 53.

For example, a copper (Cu) plating film may be used as the second plating film 52. When a copper plating film is used as the second plating film 52, the second plating film 52 is formed such that a thickness of the second plating film 52 over a large flat surface becomes 105 nm.

The first conductive portion 31 having the above structure contacts an upper surface of the first contact plug 22. Thus, the first conductive portion 31 is electrically connected to the first impurity diffusion layer 15 through the first contact plug 22.

The second conductive portion 32 is a wire (single-damascene wire) formed by the damascene method. The second conductive portion 32 is formed over the first seed layer 29 so as to fill the second opening 26. The second conductive portion 32 has a flat upper surface 32a. The upper surface 32a of the second conductive portion 32 and the upper surface 47a of the protection film 47 have the same level.

The second conductive portion 32 includes the first plating film 51, the second plating film 52, and the third plating film 53. The first plating film 51 is formed over the first seed layer 29 covering the bottom and side surfaces of the second opening 26. The second plating film 52 is formed over the first plating film 51.

As explained above, the thickness of the second plating film 52 is such that the first opening 25 is filled with the second plating film 52. For this reason, the second opening 26, which has a larger width than that of the first opening 25, cannot be completely filled with the second plating film 52. Accordingly, a recessed portion 55 is formed in an upper surface region of the second plating film 52.

The third plating film 53 is formed so as to fill the recessed portion 55 in the upper surface region of the second plating film 52. The third plating film 53 is formed at the third growth rate that is lower than the first and second growth rates. The third growth rate is, for example, 18 nm/sec to 25 nm/sec. The third plating film 53 has poorer burying characteristics than those of the first and second plating films 51 and 52. For example, a copper (Cu) plating film may be used as the third plating film 53.

The second insulating film 34 includes: a diffusion protection film 57; a low dielectric constant insulating film 58 over the diffusion protection film 57; and a protection film 59 over the low dielectric constant insulating film 58.

The diffusion prevention film 57 is formed over the first insulating film 24. The diffusion prevention film 57 is used for preventing metal included in the first and second conductive portions 41 and 42 from diffusing into an underlying layer (such as the first insulating film 24).

The diffusion prevention film 57 functions as an etching stopper film when the first and second openings 36 and 37 are formed in the second insulating film 24 by an anisotropic etching process.

For example, a silicon carbonitride (SiCN) film may be used as the diffusion prevention film 57. In this case, the thickness of the diffusion prevention film 57 may be, for example, 80 nm.

The low dielectric constant insulating film (low-k film) 58 is formed over the diffusion prevention film 57. For example, a silicon oxycarbide (SiOC) film may be used as the low dielectric constant insulating film 58. When the silicon oxycarbide (SiOC) film is used as the low dielectric constant insulating film 58, the thickness of the low dielectric constant insulating film 58 may be, for example, 600 nm.

The protection film 59 is formed over the low dielectric constant insulating film 58. The protection film 59 is a film for protecting the low dielectric constant insulating film 58 with the low mechanical strength. For example, a silicon oxide film (with a thickness of, for example, 180 nm) may be used as the protection film 59.

The first opening 36 includes: a through hole 62; and a hole 61 over the through hole 62. The second seed layer 38 is formed so as to cover an inner surface of the first opening 36. A first conductive portion (dual-damascene wire) 41 is formed over the second seed layer 38 so as to fill the first opening 36.

The hole 61 is filled with a wire 68 with a small width (one of components of the second conductive portion 41) that will be explained later. For this reason, the width $W_3$ of the hole 61 is narrow, which is, for example, 50 nm to 300 nm. The depth $D_1$ of the hole 61 may be, for example, 500 nm. The hole 61 is a hole in which voids are likely to occur for the same reason as explained with respect to the first opening 25.

The through hole 62 is formed so as to penetrate through a portion of the second insulating film 34 under the hole 61. The through hole 62 is integrated with, the hole 61. The through hole 62 exposes the upper surface 31a of the first conductive portion 31. The diameter $R_1$ of the through hole 62 is small, and is smaller than the width $W_3$ of the hole 61. The diameter $R_1$ of the through hole 62 may be, for example, 200 nm.

Since the first opening 36 includes the hole 61 with the small width and the through hole 62 with the small diameter $R_1$ as explained above, voids are more likely to occur in the first opening 36 than in the first opening 25. For this reason, the first opening 36 has to be filled with a plating film having excellent burying characteristics (specifically, first and second plating films 71 and 72).

The second opening 37 includes: a through hole 65; and a hole 64 over the through, hole 65. The second seed layer 38 is formed so as to cover an inner surface of the second opening 37. A second conductive portion (dual-damascene wire) 42 is formed over the second seed layer 38 so as to fill the second opening 37.

The width of the hole 64 is larger than that of the hole 61. The depth of the hole 64 is equal to the depth $D_1$ of the hole 61. A width $W_4$ of the hole 64 may be, for example, 500 nm to 3000 nm. For this reason, to fill the hole 64 with a plating film, a plating film with a large thickness (specifically, the third plating film 73) has to be formed.

Therefore, a plating process has to be carried out for a long time to fill the entire hole 64 with the second plating film 52 with excellent burying characteristics and a low growth rate. Since the width $W_4$ of the hole 64 is large, voids are less likely to occur in the hole 64 than in the hole 61 with the narrower width. For this reason, when the hole 64 is filled with a plating film with a high growth rate (such as the third plating film 73 that will be explained later), voids are not likely to be included in the plating film.

The through hole 65 is formed so as to penetrate through a portion of the second insulating film 34 under the hole 64. The through hole 65 is integrated with the hole 64. The through hole 65 exposes the upper surface 32a of the second conductive portion 32. The through hole 65 has a small diameter $R_2$, which is much smaller than the width $W_4$ of the hole 64.

For this reason, the through hole 65 with the small diameter $R_2$ has to be filled with a plating film having excellent burying characteristics (specifically, first and second plating films 71 and 72) in order to prevent voids from occurring.

The second seed layer 38 is formed so as to cover bottom and side surfaces of the first opening 36, and bottom and side surfaces of the second opening 37. The second seed layer 38 is a power feeding layer when the first and second conductive portions 41 and 42 are formed by the electrolytic plating method. As the second seed layer 38, a multi-layered film may be used, which includes, for example, a tantalum (Ta) layer (with a thickness of, for example, 20 nm) and a copper (Cu) layer (with a thickness of, for example, 50 nm) over the tantalum layer.

The first conductive portion 41 is a wire (dual-damascene wire) formed by the damascene method. The first conductive portion 41 is formed over the first seed layer 38 so as to fill the first opening 36. The first conductive portion 41 has a flat upper surface 41a. The upper surface 41a of the first conductive portion 41 and an upper surface 59a of the protection film 59 (i.e., the top surface of the second insulating film 34) have the same level.

The first conductive portion 41 includes a second contact plug 67 and a wire 68. The second contact plug 67 is formed over the second seed layer 38 so as to fill the through hole 62. The second contact plug 67 includes lower portions of the first and second plating films 71 and 72, which fill the through hole 62. The second contact plug 67 contacts the upper surface 31a of the first conductive portion 31. Thus, the second contact plug 67 is electrically connected to the first impurity diffusion layer 15 through the first conductive portion 31.

The wire 68 is formed over the second seed layer 38 and the second contact plug 67 so as to fill the hole 61. The wire 68 is integrated with the second contact plug 67. The wire 68 includes upper portions of the first and second plating films 71 and 72, which fill the hole 61.

Hereinafter, the first and second plating films 71 and 72 included in the first conductive portion 41 are explained. The first plating film 71 is formed over the second seed layer 38 covering the bottom and side surfaces of the first opening 36. The first plating film 71 is a plating film formed by a similar method to the above-explained method of forming the first plating film 51, and has excellent burying characteristics.

For example, a copper (Cu) plating film may be used as the first plating film 71. When a copper plating film is used as the first plating film 71, the first plating film 71 is formed such that a thickness of the first plating film 71 over a large flat surface becomes 15 nm. The first plating film 71 achieves a similar effect to that achieved by the first plating film 51 (specifically, the effect of preventing voids from being included in the second plating film 71).

The second plating film 72 is formed over the first plating film 71 so as to fill the first opening 36. The thickness of the second plating film 72 is such that the first opening 36 is filled with the second plating film 72. The second plating film 72 is formed by a similar method to the above-explained method of forming the second plating film 52, and has excellent burying characteristics.

For example, a copper (Cu) plating film may be used as the second plating film 72. When a copper plating film is used as the second plating film 72, the second plating film 72 is formed such that a thickness of the second plating film 72 over a large flat surface becomes 210 nm.

The second conductive portion 42 is a dual-damascene wire formed by the damascene method. The second conductive portion 42 is formed over the second seed layer 38 so as to fill the second opening 37. The second conductive portion 42 has a flat upper surface 42a. The upper surface 42a of the second conductive portion 42 and the upper surface 59a of the protection film 59 have the same level.

The second conductive portion 42 includes a second contact plug 75 and a wire 76. The second contact plug 75 is formed over the second seed layer 38 so as to fill the through hole 65. The second contact plug 75 contacts the upper surface 32a of the second conductive portion 32. Thus, the second contact plug 75 is electrically connected to the first conductive portion 32. The second contact plug 75 includes lower portions of the first and second plating films 71 and 72, which fill the through hole 65.

The wire 76 is formed over the second seed layer 38 and the second contact plug 75 so as to fill the hole 64. The wire 76 is integrated with the second contact plug 75. The wire 76 includes upper portions of the first to third plating films 71 to 73, which fill the hole 64.

The first plating film 71 is formed over the second seed layer 38 covering the bottom and side surfaces of the second opening 37. The second plating film 72 is formed over the first plating film 71 so as to fill up the through hole 65.

As explained above, the thickness of the second plating film 72 is such that the first opening 36, which has a smaller width than that of the second opening 72, is filled with the second plating film 72. For this reason, the hole 64 of the second opening 37 cannot be completely filled with the second plating film 72. Accordingly, a recessed portion 78 is formed in an upper surface region of the second plating film 72.

The third plating film 73 is formed so as to fill the recessed portion 78 in the upper surface region of the second plating film 72. The third plating film 73 can be formed by a similar method to the above-explained method of forming the third plating film 53. For example, a copper (Cu) plating film may be used as the third plating film 73.

Hereinafter, a method of manufacturing the semiconductor device 10 according to the first embodiment is explained with reference to FIGS. 2 to 21. FIGS. 2 to 21 are cross-sectional views illustrating a process flow indicative of the method of manufacturing the semiconductor device 10. Like reference numerals denote like elements through FIGS. 1 to 21.

Figure 2:
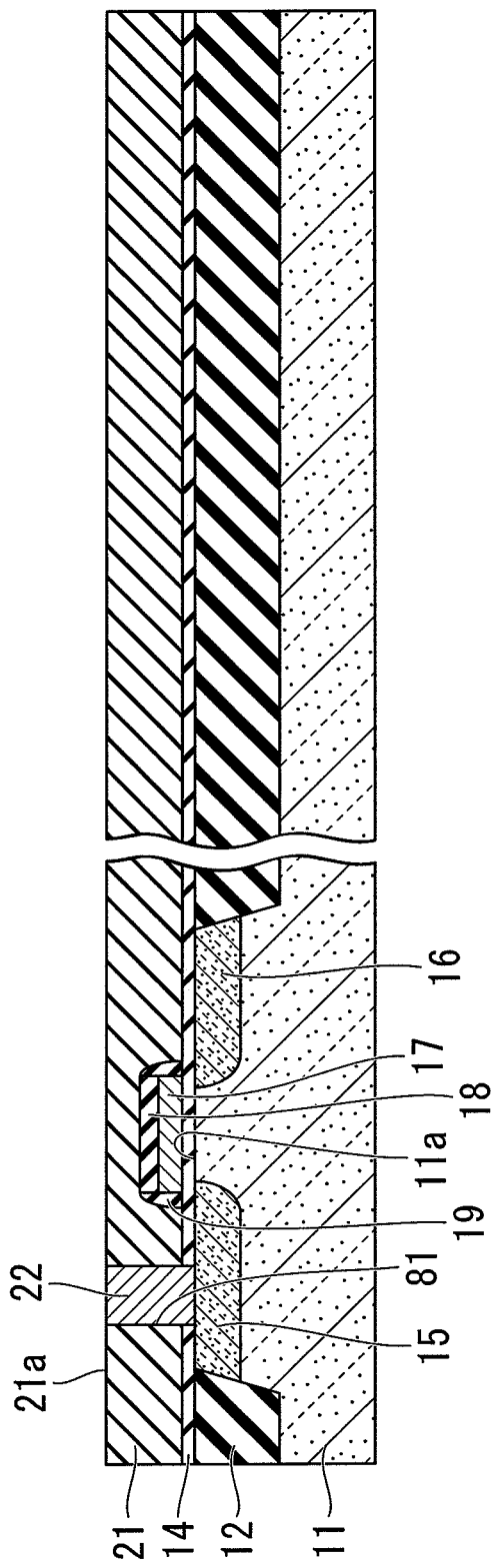
FIGS. 2 to 21 are cross-sectional views illustrating a process flow indicative of a method of manufacturing the semiconductor device according to the first embodiment.

In a process shown in FIG. 2, the device isolation region 12 and the first and second impurity diffusion regions 15 and 16 are formed in the semiconductor substrate (such as a silicon substrate) 11 by a known method. Then, the gate insulating film 14, the gate electrode 17, the silicon nitride film 18, the sidewall 19, the first inter-layer insulating film 21, and the first contact plug 22 are formed over the semiconductor substrate 11 by a known method.

The device isolation region 12 is formed by, for example, filling a device isolation groove formed in the semiconductor substrate 11 with an insulating film, such as a silicon oxide ($SiO_2$) film or a silicon nitride ($SiN_2$) film. For example, a silicon oxide ($SiO_2$) film may be used as the gate insulating film 14.

The first and second impurity diffusion regions 15 and 16 are formed by, for example, introducing, into the semiconductor substrate 11, an impurity having a different conductivity type from that of the semiconductor substrate 11.

The gate electrode 17 is formed by, for example, forming a conductive film such as a poly-silicon (Poly-Si) film, or a tungsten (W) film, forming the silicon nitride film 18 over the conductive film, and then patterning the conductive film by anisotropic etching with the silicon nitride film 18 as a mask.

The sidewall 19 is formed by, for example, forming a silicon nitride film covering the gate electrode 17 and the silicon nitride film 18, and then etching the silicon nitride film.

For example, a silicon oxide ($SiO_2$) film may be used as the first inter-layer insulating film 21. The first contact plug 22 is formed by, for example, forming, in the first inter-layer insulating film 21, a through hole 81 partially exposing the first impurity diffusion layer 15, and then forming a conductive film (such as a tungsten film) filling the through hole 81.

Figure 3:
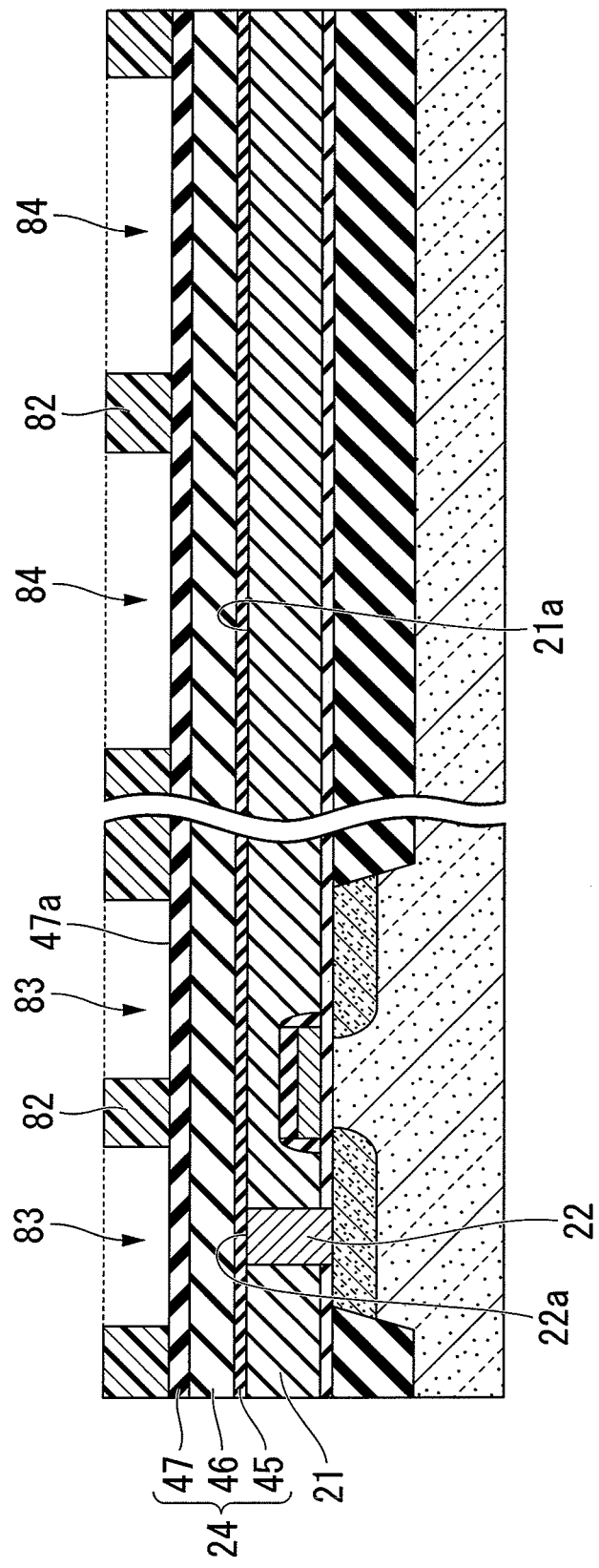

In a process shown in FIG. 3, the diffusion prevention film 45 is formed over the surface 21a of the first inter-layer insulating film 21 and the upper surface 22a of the first contact plug 22. Then, the low dielectric constant insulating film 46 is formed over the diffusion prevention film 45. Then, the protection film 47 is formed over the low dielectric constant insulating film 46. Thus, the first insulating film 24 is formed, which includes the diffusion prevention film 45, the low dielectric constant insulating film 46, and the protection film 47.

Specifically, the diffusion prevention film 45, the low dielectric constant insulating film 46, and the protection film 47 are formed by, for example, a PE-CVD (Plasma Enhanced-Chemical Vapor Deposition) method.

For example, a silicon carbonitride (SiCN) film may be used as the diffusion prevention film 45. When a silicon carbonitride film is used as the diffusion prevention film 45, the thickness of the prevention diffusion film 45 may be, for example, 30 nm.

For example, a silicon oxycarbide (SiCN) film may be used as the low dielectric constant insulating film 46. When the silicon oxycarbide film is used as the low dielectric constant insulating film 46, the thickness of the low dielectric constant insulating film 46 may be, for example, 110 nm.

For example, a silicon oxide film (with the thickness of, for example, 180 nm) may be used as the protection film 47.

Thus, the silicon carbonitride (SiCN) film, the silicon oxycarbide (SiOC) film, and the silicon oxide ($SiO_2$) film are sequentially deposited to form the first insulating film 24. Thereby, the electric capacitance between the first and second conductive portions 31 and 32 can be reduced. Additionally, the silicon oxycarbide film with low mechanical strength can be protected by the silicon oxide film.

Further, the silicon carbonitride film is formed over the first inter-layer insulating film 21. Thereby, the silicon carbonitride film can be used as an etching stopper film when the low dielectric constant insulating film 46 and the protection film 46 are anisotropically etched (for example, dry-etched).

Then, a first etching resist film 82 having openings 83 and 84 are formed over the surface 47a of the protection film 47. In this case, the opening 83 is formed so as to expose a portion of the upper surface 47a of the protection film 47, the position of which corresponds to the formation region of the first opening 25. The opening 84 is formed so as to expose a portion of the upper surface 47a of the protection film 47, the position of which corresponds to the formation region of the second opening 26.

Figure 4:
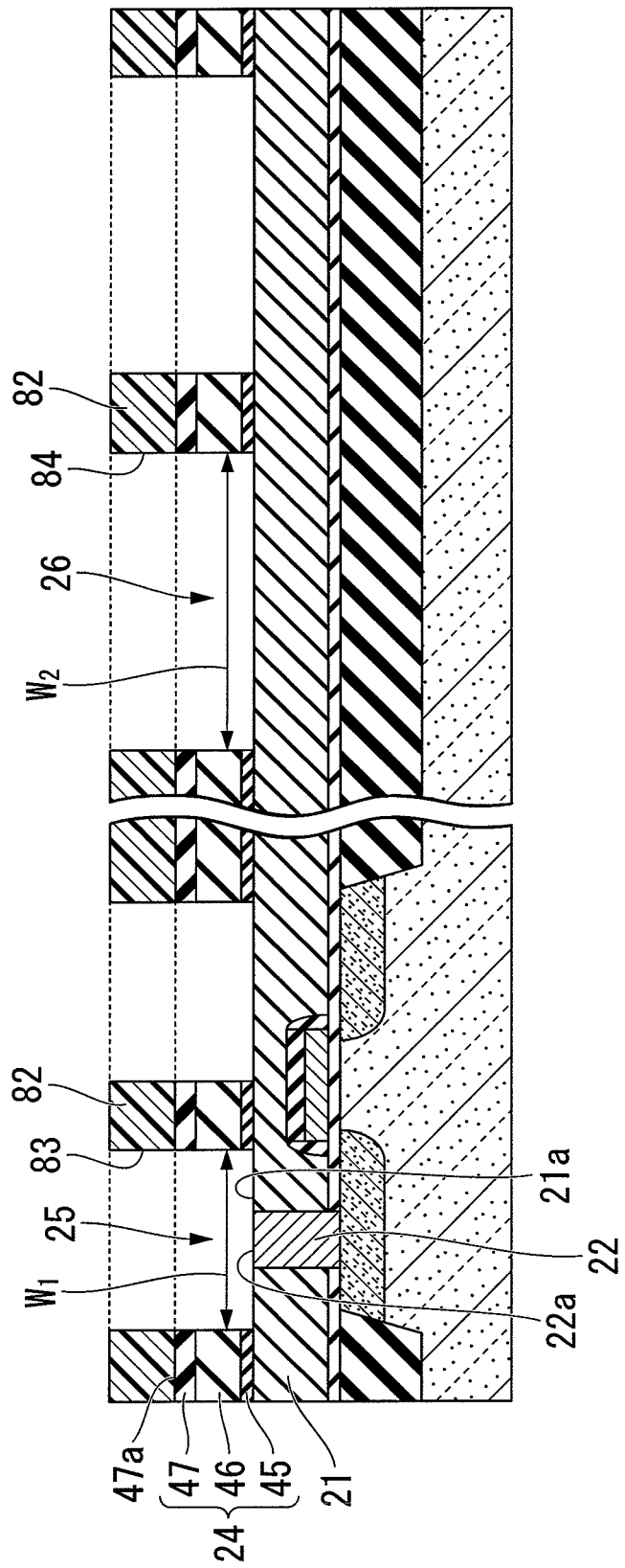

In a process shown in FIG. 4, the first insulating film 24 is anisotropically etched (dry-etched) with the first etching resist film 82 as a mask until the upper surface 21a of the first inter-layer insulating film 21 is exposed. Thus, the first and second openings (through holes) 25 and 26, which have different widths, are formed in the first insulating film 24 (opening formation process).

At this time, the low dielectric constant insulating film 46 and the protection film 47 under the openings 83 and 84 are etched with high selectivity with respect to the diffusion prevention film 45. Then, the portions of the diffusion prevention film 45, which are exposed to the openings 83 and 84, are etched with high selectivity with respect to the first inter-layer insulating film 21 and the first contact plug 22. Thus, the first and second openings 25 and 26 are formed, thereby preventing the first inter-layer insulating film 21 and the first contact plug 22 under the first and second openings 25 and 26 from being damaged.

Among multiple openings having different widths, the first opening 25 is an opening having the width $W_1$ such that it is difficult to fill the first opening 25 with the third plating film 53 with a high growth rate. The width $W_1$ of the first opening 25 may be, for example, 50 nm to 300 nm.

Among multiple openings having different widths, the second opening 26 has a width $W_2$ which is larger than the width $W_1$ of the first opening 25. The width $W_2$ of the second opening 26 may be, for example, 500 nm to 3000 nm.

Figure 5:
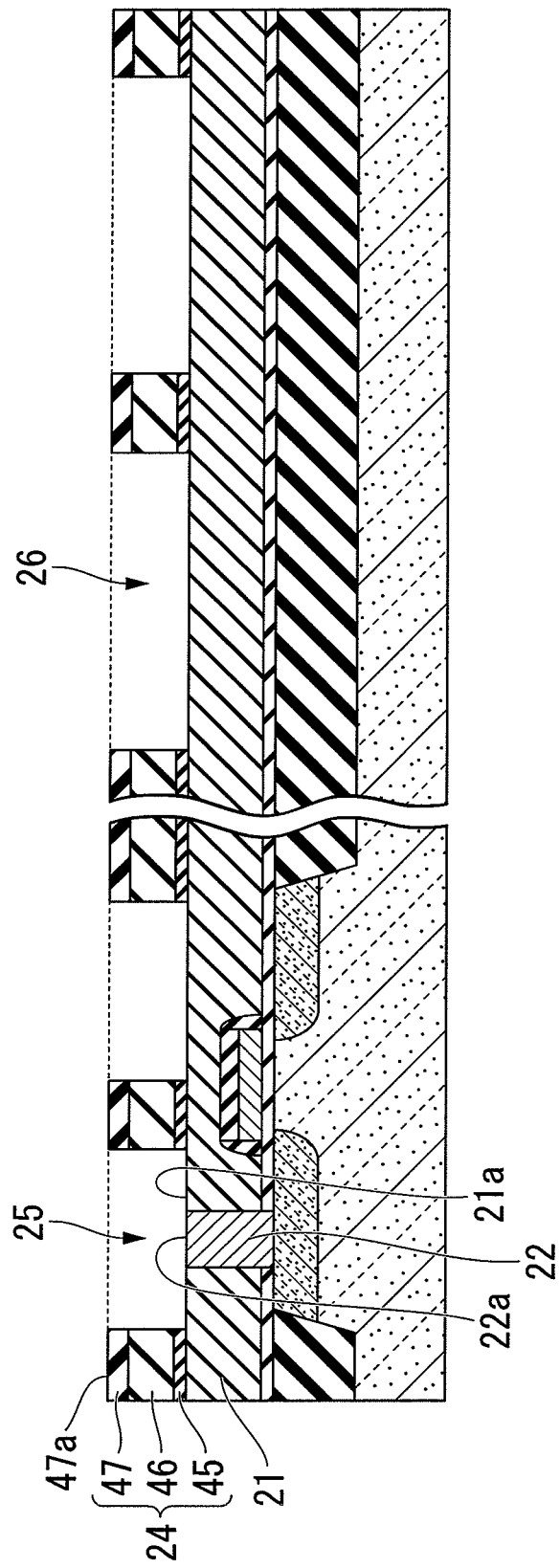

In a process shown in FIG. 5, the first etching resist film 82 shown in FIG. 4 is removed. In a process shown in FIG. 6, the first seed layer 29 is formed so as to cover the upper surface 47a of the protection film 47 (corresponding to the top surface of the first insulating film 24), and inner surfaces of the first and second openings 25 and 26 (seed layer formation process).

Specifically, the first seed layer 29 can be formed by a spattering method. As the first seed layer 29, a multi-layered film may be used, which includes, for example, a tantalum (Ta) layer (with a thickness of, for example, 20 nm) and a copper (Cu) layer (with a thickness of, for example, 50 nm) over the tantalum layer.

Here, a plating apparatus 90, which is used for the process of forming the first to third plating films, is explained with reference to FIG. 22 before processes shown in FIGS. 7 to 21 are explained.

The plating apparatus 90 includes: a plating container 91; a positive electrode 93; a plating solution providing line 94; a plating solution provider 96; a plating solution discharging line 97; a plating solution discharger 98; a controller 99; and a semiconductor substrate holder 101.

The plating container 91 houses the plating solution 92 and the positive electrode 93. A temperature of the plating solution 92 in the plating container 91 can be adjusted by a temperature adjuster (not shown).

The positive electrode 93 is placed on a bottom surface of the plating container 91 filled with the plating solution 92. The positive electrode 93 is electrically connected to the controller 99.

One end of the plating solution providing line 94 is connected to a lower side surface of the plating container 91. The other end of the plating solution providing line 94 is connected to the plating solution provider 96.

The plating solution provider 96 is connected to the plating solution providing line 94 and is electrically connected to the controller 99. Upon receiving a plating solution providing signal from the controller 99, the plating solution provider 96 provides a new plating solution 92 to the plating container 91.

One end of the plating solution discharging line 97 is connected to a lower side surface of the plating container 91. The other end of the plating solution discharging line 97 is connected to the plating solution discharger 98.

The plating solution discharger 98 is connected to the plating solution discharging line 97 and is electrically connected to the controller 99. Upon receiving a plating solution discharging signal from the controller 99, the plating solution ejector 98 discharges the old plating solution 92 from the plating container 91.

The controller 99 is electrically connected to the positive electrode 93, the plating solution provider 96, the plating solution discharger 98, and the semiconductor substrate holder 101. The controller 99 performs the entire control of the plating device 90. The controller 99 provides power to the first and second seed layers 29 and 38 formed over the semiconductor substrate 11. Additionally, the controller 99 adjusts the amount of current (specifically, first to third currents $I_1$, $I_2$, and $I_3$) to be applied to the first and second seed layers 29 and 38, to a predetermined current value. Further, the controller 99 controls the amount of time required for the plating process.

Moreover, the controller 99 controls a driver (not shown) that drives the semiconductor substrate holder 101 to move the semiconductor substrate holder 101 holding the semiconductor substrate 11 in the vertical direction (i.e., a direction vertical to the bottom surface of the plating container 91). Thus, the controller 99 immerses the semiconductor substrate 11 in the plating solution 92 or takes the semiconductor substrate 11 out of the plating solution 92.

The semiconductor substrate holder 101 includes: a holding cup 102; a seal member 103; a negative electrode 104; and a pressing member 105. The holding cup 102 has a ring shape. A bottom surface of the holding cup 102 has a hole 107 that exposes a region of a surface of the semiconductor substrate 11, which corresponds to a plating film formation region. The semiconductor substrate 11 is placed on a bottom portion of the holding cup 102 outside the hole 107.

The seal member 103 is provided at a portion of the holding cup 102, which is adjacent to the hole 107. The seal member 103 has a ring shape, and contacts an outer periphery of the semiconductor substrate 11. The seal member 103 is used for preventing the plating solution 92 from penetrating a portion of the semiconductor substrate 11 outside the seal member 103. The seal member is also used for preventing a plating film from being formed in the negative electrode 104 outside the seal member 103.

The negative member 104 is provided on a bottom portion of the holding cup 102, which is positioned outside the seal member 103. The negative electrode 104 contacts a seed layer (not shown), such as the first seed layer 29 or the second seed layer 38.

The pressing member 105 contacts an upper surface of the semiconductor substrate 11 placed on the holding cup 102. Thus, the semiconductor substrate 11 is held by the semiconductor substrate holder 101. A rotation driver (not shown) of the semiconductor substrate holder 101 holds the semiconductor substrate 11 in a rotatable manner when a plating process is carried out.

Figure 22:
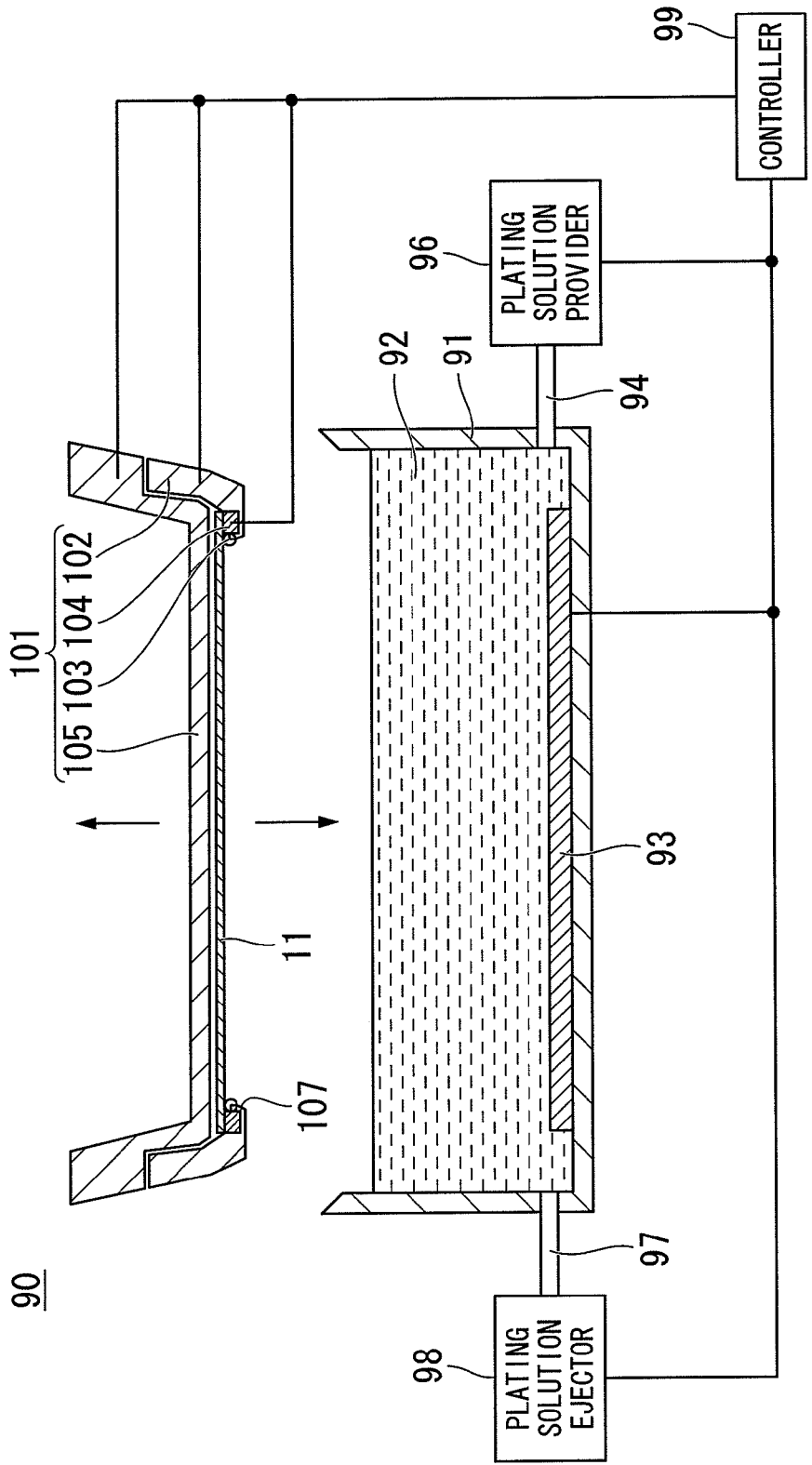
FIG. 22 illustrates a plating apparatus used for forming first to third plating films.

In a process shown in Fie. 7, the first plating film 51, which covers the surface 29a of the first seed layer 29, is formed at the first growth rate by an electrolytic plating method using the plating apparatus 90 shown in FIG. 22, so as not to completely fill the first opening 25 (first plating film formation process). The first growth rate is, for example, 2.5 nm/sec to 3.2 nm/sec.

Figure 6:
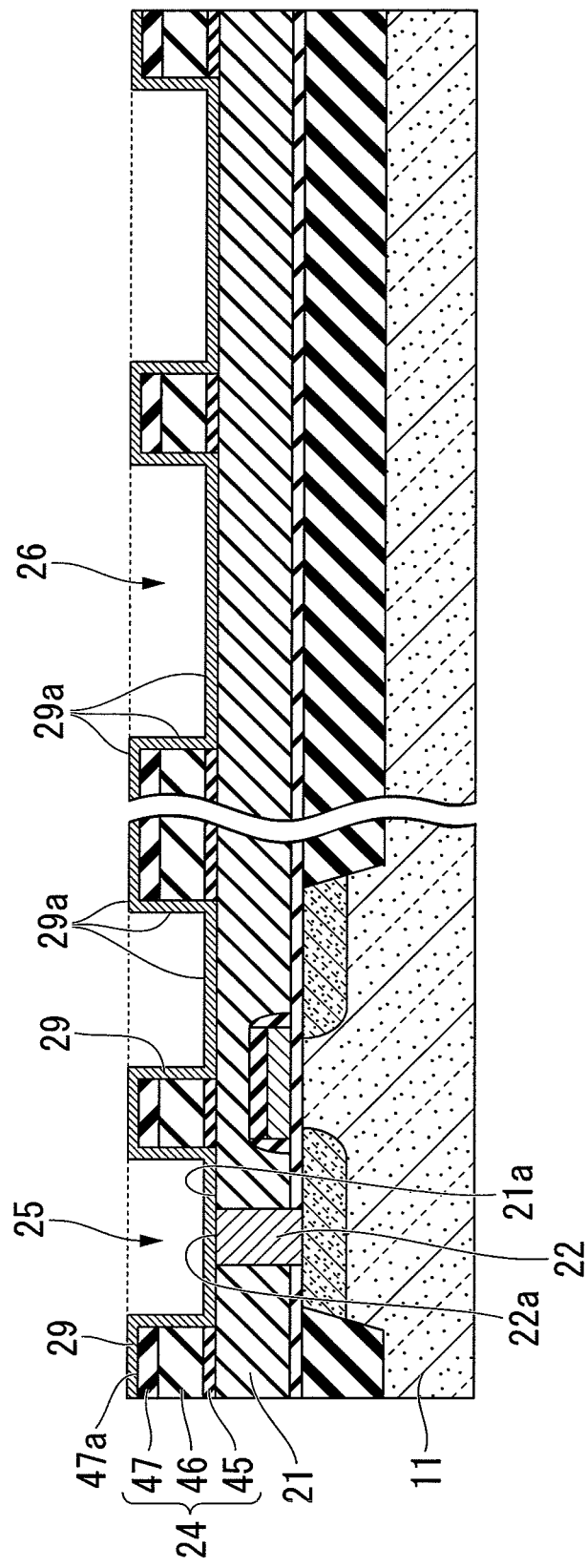

At this time, the first current $I_1$ to be applied to the first seed layer 29 may be, for example, 4.5 A. For example, a copper (Cu) plating film may be used as the first plating film 51. Specifically, for example, a Cu plating solution at a temperature of 25° C. is used as the plating solution 92. Then, the structure shown in FIG. 6 is immersed in the plating solution 92. Then, the structure shown in FIG. 6 is rotated at the speed of 12 rpm. Then, the first current $I_1$ (a value of which is, for example, 4.5 A) is applied to the first seed layer 29. Then, a plating process is carried out for 5.5 seconds. Thus, the first plating film 51 is formed. The first plating film 51 is formed such that the thickness of the first plating film 51 over a large flat surface becomes 15 nm.

As a Cu plating solution used in the first plating formation process, for example, a mixed solution may be used, which contains water ($H_2O$), copper sulfate pentahydrate ($CuSO_4.5H_2O$), sulfuric acid ($H_2SO_4$), and hydrochloric acid (HCl), and to which an additive (such as an accelerator that accelerates growth of a plating film from a bottom portion of the hole) is added.

As the Cu plating solution, it is possible to use a mixed solution obtained by, for example, blending: water ($H_2O$) by a percentage of 74% to 83%; copper sulfate pentahydrate by a percentage of 10% to 20%; hydrochloric acid by a percentage of 1% to 5%; and hydrochloric acid by a percentage of less than or less than 1%. The additive may be added to the mixed solution by a percentage of 5% to 11%.

Thus, the first plating film 51 is formed over the surface 29a of the first seed layer 29 at the first growth, rate that is lower than the second and third growth rates. Thereby, thin portions and discontinuous portions of the first seed layer 29 can be covered by the first plating film 51. Accordingly, voids can be prevented from being included in the second plating film 52 to be formed so as to fill the first opening 25.

Further, the first plating film 51 is formed so as not to fully fill the first opening 25. In other words, the thickness of the first plating film 51 is made small. Thereby, it is possible to reduce the plating process time for the first plating film 51 with a very low growth rate.

The value of the first current $I_1$ is not limited to 4.5 A. The plating process time for the first plating film is not limited to the above value.

Figure 8:
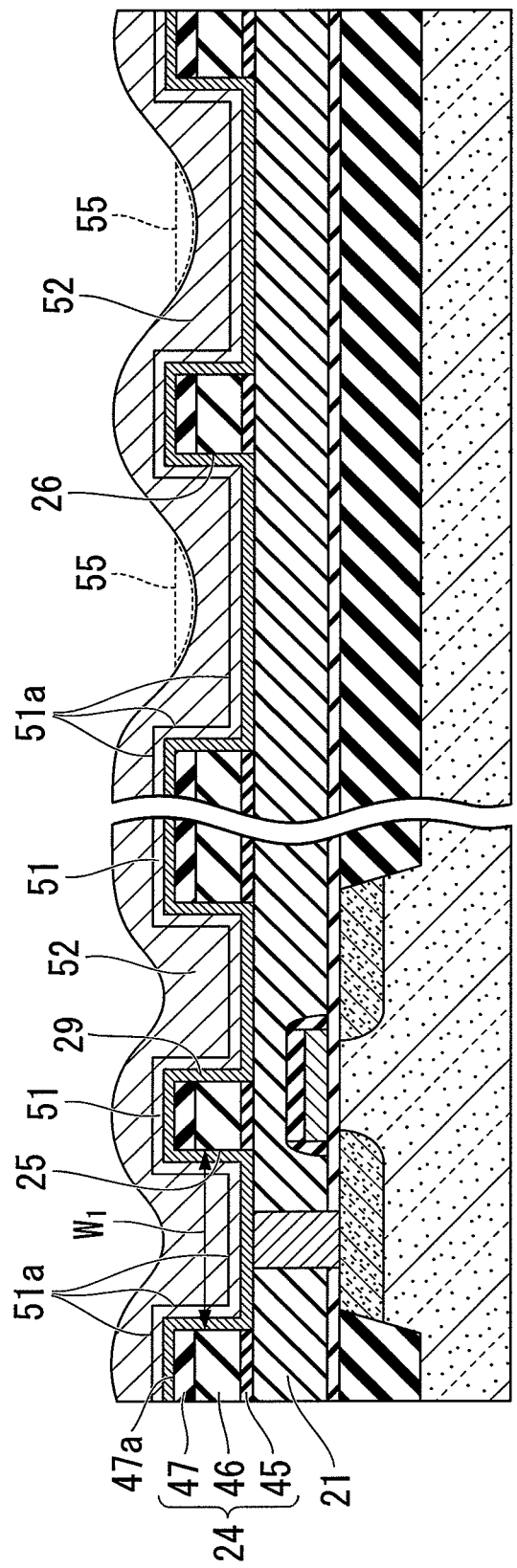

In a process shown in FIG. 8, the second plating film 52 is formed over a surface 51a of the first plating film 51 using the plating apparatus 90 shown in FIG. 22, at the second growth rate that is higher than the first growth rate and prevents voids from occurring (second plating film formation process). The second growth rate is, for example, 3.4 nm/sec to 4.5 nm/sec.

At this time, a second current $I_2$ to be applied to the first seed layer 29 is larger than the first current $I_1$. A value of the second current $I_2$ may be, for example, 6.75 A.

The second plating film 52 is formed so as to fill at least the first opening 25. At this time, a recessed portion 55 is formed in an upper surface region of the second plating film 52 that partially fills the second opening 26 with the wider width than that of the first opening 25.

Figure 7:
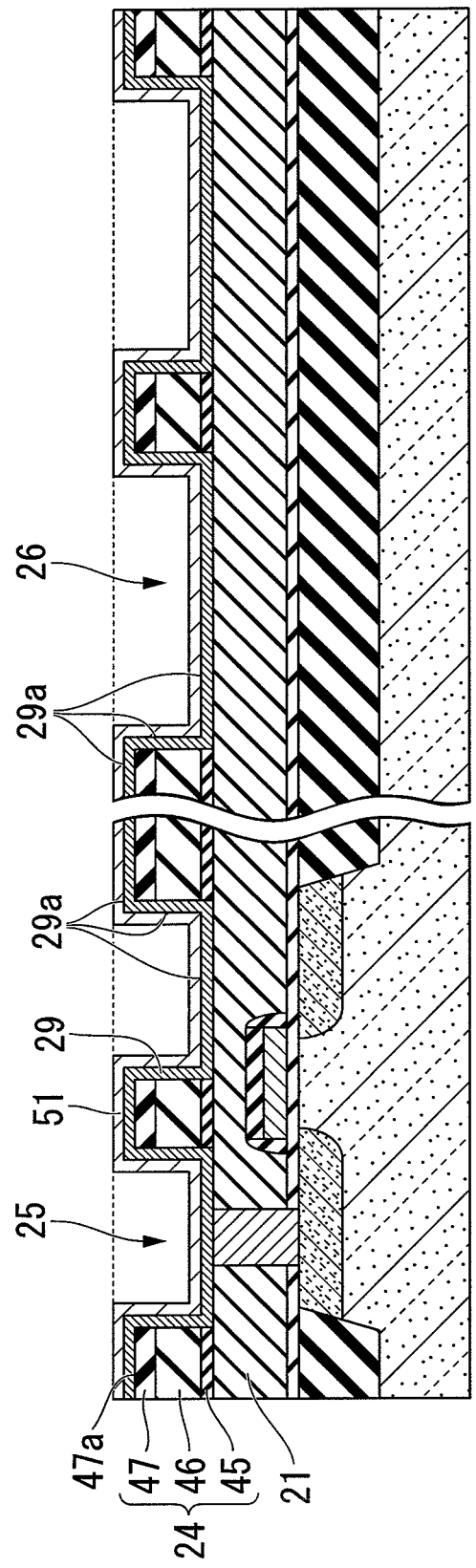

For example, a Cu plating film may be used as the second plating film 52. When the Cu plating film is used as the second plating film 52, the structure shown in FIG. 7 is immersed in a Cu plating solution at a temperature of 25° C., which is used as the plating solution 92. Then, the structure shown in FIG. 7 is rotated at the speed of 12 rpm. Then, the second current $I_2$ (a value of which is for example, 6.75 A) is applied to the first seed layer 29. Then, a plating process is carried out for 30 seconds. Thus, the second plating film 52 is formed. The second plating film 52 is formed such that a thickness of the second plating film 52 over a large flat surface becomes 105 nm.

Thus, the first opening 25 is filled with the second plating film 52 with a low growth rate, thereby preventing voids from occurring in the first opening 25 with the small width $W_1$. Additionally, the first opening 25 is filled with the first and second plating films 51 and 52, thereby reducing a time required for filling the first opening 25 with the first and second plating films 51 and 52 compared to the case in which the first opening 25 is filled with only the first plating film 51. The value of the second current $I_2$ (for example, 6.75 A) is not limited to the above value.

Further, the second plating film 52 is formed in the process shown in FIG. 8 (second plating film formation process) so as to fill up at least the first opening 25 (with the smaller width than that of the second opening 26), thereby reducing a plating process time for the second plating film 52 with the low growth rate.

Moreover, the recessed portion 55 is formed in the upper surface region of the second opening 26 in the process shown in FIG. 8 (second plating film formation process). However, voids are not likely to occur in the second opening 26. Accordingly, the second opening 26 can be easily filled with the third plating film 53 (with a high growth rate) after the second plating film formation process.

As a plating solution 92 to be used for the second plating film formation process, the same plating solution as used in the first plating film formation process may be used. Accordingly, the first and second plating films 51 and 52 can be sequentially formed.

Figure 9:
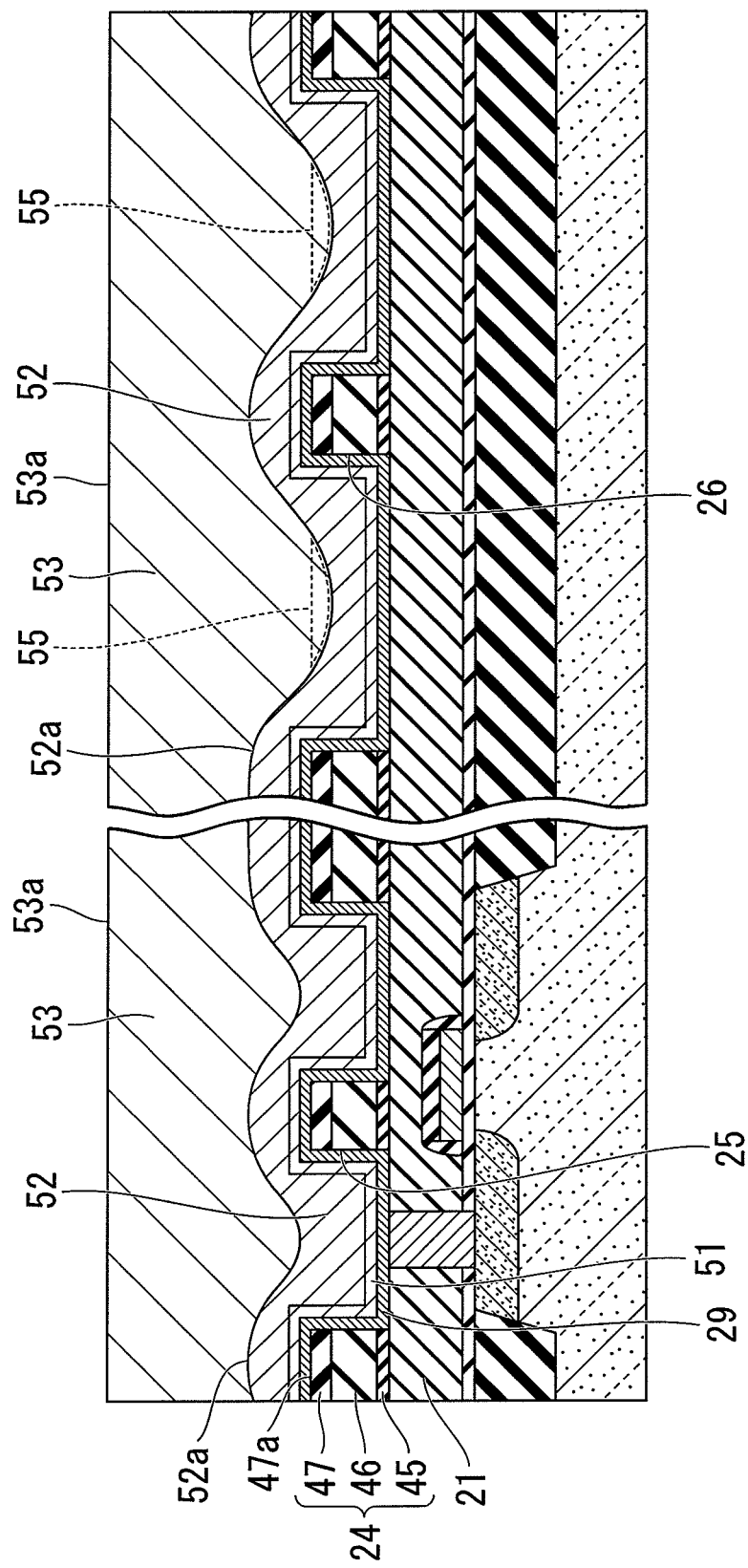

In a process shown in FIG. 9, the third plating film 53, which fills the recessed portion 55, is formed over a surface 52a of the second plating film 52, at the third growth rate that is higher than the second growth rate (third plating film formation process). The third growth rate is, for example, 18 nm/sec to 25 nm/sec.

For example, a Cu plating film may be used as the third plating film 53. In this case, the structure shown in FIG. 8 is immersed in a Cu plating solution at a temperature of 25° C., which is used as the plating solution 92. Then, the structure shown in FIG. 8 is rotated at a speed of 12 rpm. Then, the third current $I_3$ (a value of which is, for example, 40.5 A), which is larger than the first and second currents $I_1$ and $I_2$, is applied to the first seed layer 29. Then, a plating process is carried out for 30 seconds. Thus, the third plating film 53 is formed. The third plating film 53 is formed such that a thickness of the third plating film 53 on a large flat surface becomes 630 nm.

Thus, the recessed portion 55 in the upper surface region of the second plating film 52 is filled with the third plating film 53, thereby preventing dishing from occurring in the plating film filling the second opening 26 at the time of polishing in the conductive portion formation process that will be explained later.

Additionally, the recessed portion 55 is filled with the third plating film 53 with a higher growth rate than that of the second plating film 52, thereby making the amount of time for filling the recessed portion 55 with the third plating film 53 being shorter than filling the recessed portion 55 with only the second plating film 52.

In the third plating film formation process, the third plating film 53 is formed so that an upper surface 53a of the third plating film 53 becomes flat. By making the upper surface 53a of the third plating film 53 flat, a polishing of the plating film in the next conductive portion formation process (see FIG. 10) is carried out at a constant speed, irrespective of the shape and layout of the first and second openings 25 and 26. Thereby, dishing and erosion can be prevented from occurring. Accordingly, a thickness of the second conductive portion 32 filling the second opening 26 can be identical to that of the first conductive portion 31 filling the first opening 25.

Figure 10:
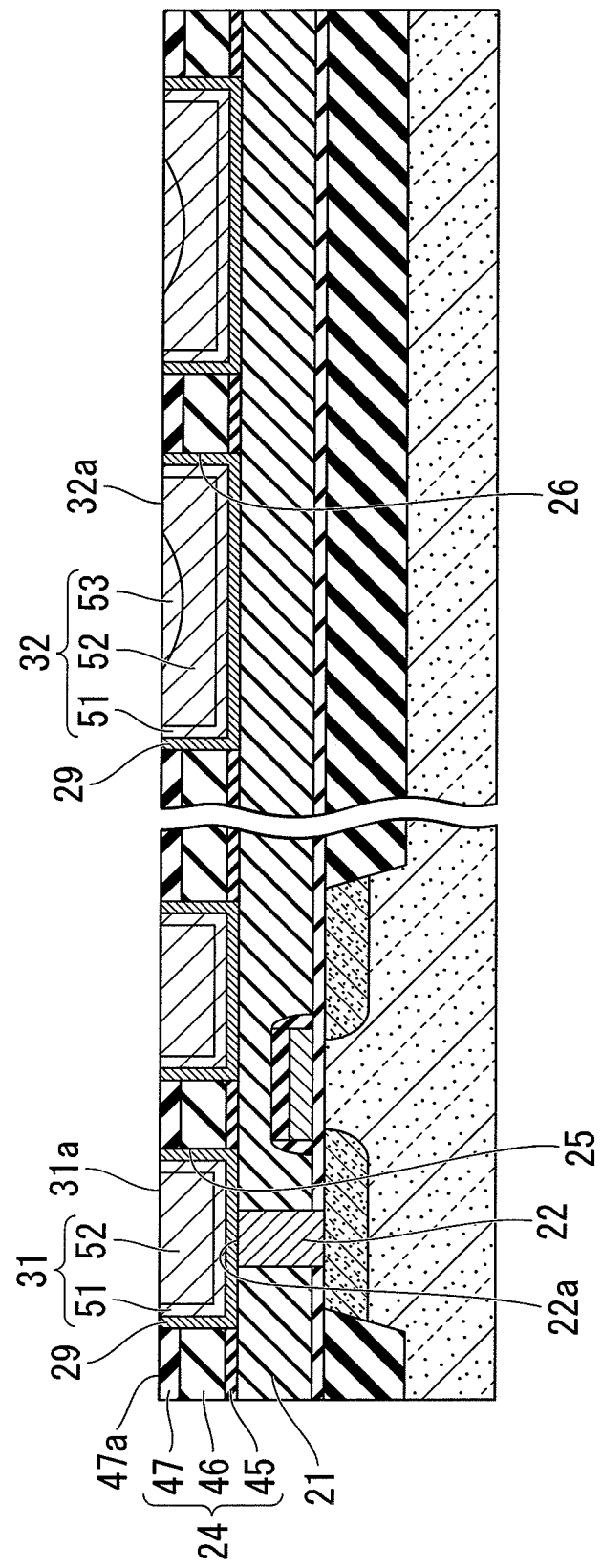

In a process shown in FIG. 10, portions of the first seed layer 29 and the first to third plating films 51 to 53, which are higher in level than the upper surface 47a of the protection film 47, are removed by a polishing to form the first and second conductive portions 31 and 32 filling the first and second openings 25 and 26, respectively (conductive portion formation process). The first conductive portion 31 includes the first and second plating films 51 and 52, and fills the first opening 25. The second conductive film 32 includes the first to third plating films 51 to 53, and fills the second opening 26.

Specifically, the above polishing is carried out by a CMP (Chemical Mechanical Polishing) method. As explained above, the upper surface 53a of the third plating film 53 is made flat before the polishing, the upper surface 47a of the protection film 47, the upper surface 31a of the first conductive portion 31, and the upper surface 32a of the second conductive portion 32 have the same level after the polishing. In other words, the structure shown in FIG. 10 has a flat upper surface.

Figure 11:
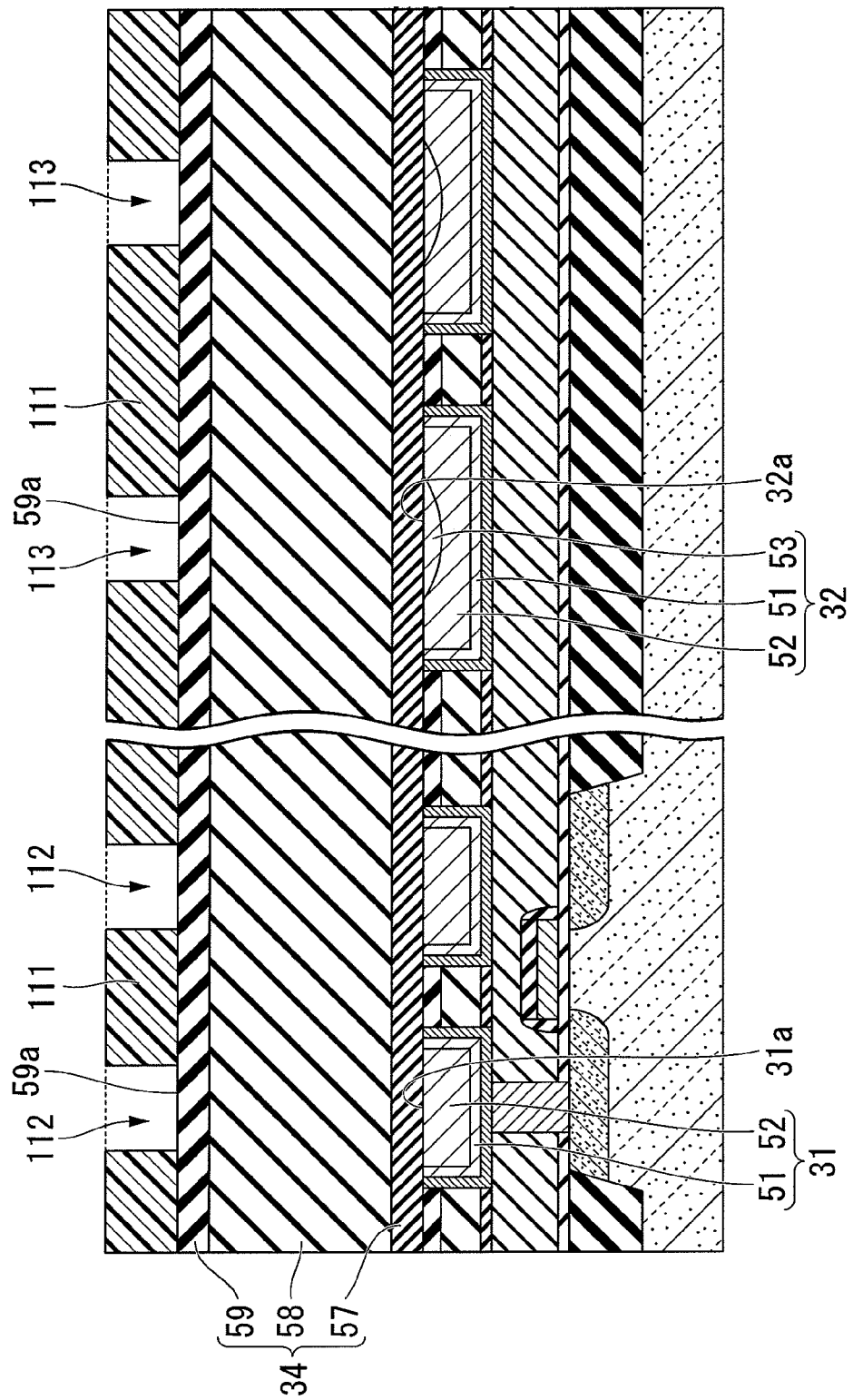

In, a process shown in FIG. 11, the diffusion prevention film 57 is formed over the upper surface of the structure shown in FIG. 10 (specifically, the upper surface 47a of the protection film 47, the upper surface 31a of the first conductive portion 31, and the upper surface 32a of the second conductive portion 32). Then, the low dielectric constant insulating film 58 is formed over the diffusion prevention film 57. Then, the protection film 59 is formed over the low dielectric constant insulating film 58. Thus, the second insulating film, 34 is formed, which includes the diffusion prevention film 57, the low dielectric constant insulating film 58, and the protection film 59. The second insulating film 34 may be formed by the same method by which the first insulating film 24 is formed.

For example, a silicon carbonitride (SiCN) film may be used as the diffusion prevention film 57. When a silicon carbonitride film is used as the diffusion prevention film 57, a thickness of the silicon carbonitride film may be, for example, 80 nm.

For example, a silicon oxycarbide (SiOC) film may be used as the low dielectric constant insulating film 58. When a silicon oxycarbide film is used as the low dielectric constant insulating film 58, a thickness of the silicon oxycarbide film may be, for example, 600 nm.

For example, a silicon oxide ($SiO_2$) film (with a thickness of, for example, 180 nm) may be used as the protection film 59.

Thus, the silicon carbonitride (SiCN) film, the silicon oxycarbide (SiOC) film, and the silicon oxide film are sequentially deposited to form the second insulating film 34. Thereby, a capacitance between the first and second conductive portions 41 and 42 can be reduced, and the silicon oxycarbide (SiCN) film with the small mechanical strength can be protected.

Additionally, the silicon carbonitride (SiCN) film is formed over the first insulating film 24, and thereby functions as an etching stopper film when the first and second openings 36 and 37 are formed in the second insulating film 34 by an anisotropic etching (for example, dry etching) process.

Then, a second etching resist film 111, which has holes 112 and 113, is formed over the surface 59a of the protection film 59. At this time, the hole 112 is formed so as to expose a portion of the surface 59a of the protection film 59, the position of which corresponds to a formation region of the through hole 62. The hole 113 is formed so as to expose a portion of the surface 59a of the protection film 59, the position of which corresponds to a formation region of the through hole 65.

Figure 12:
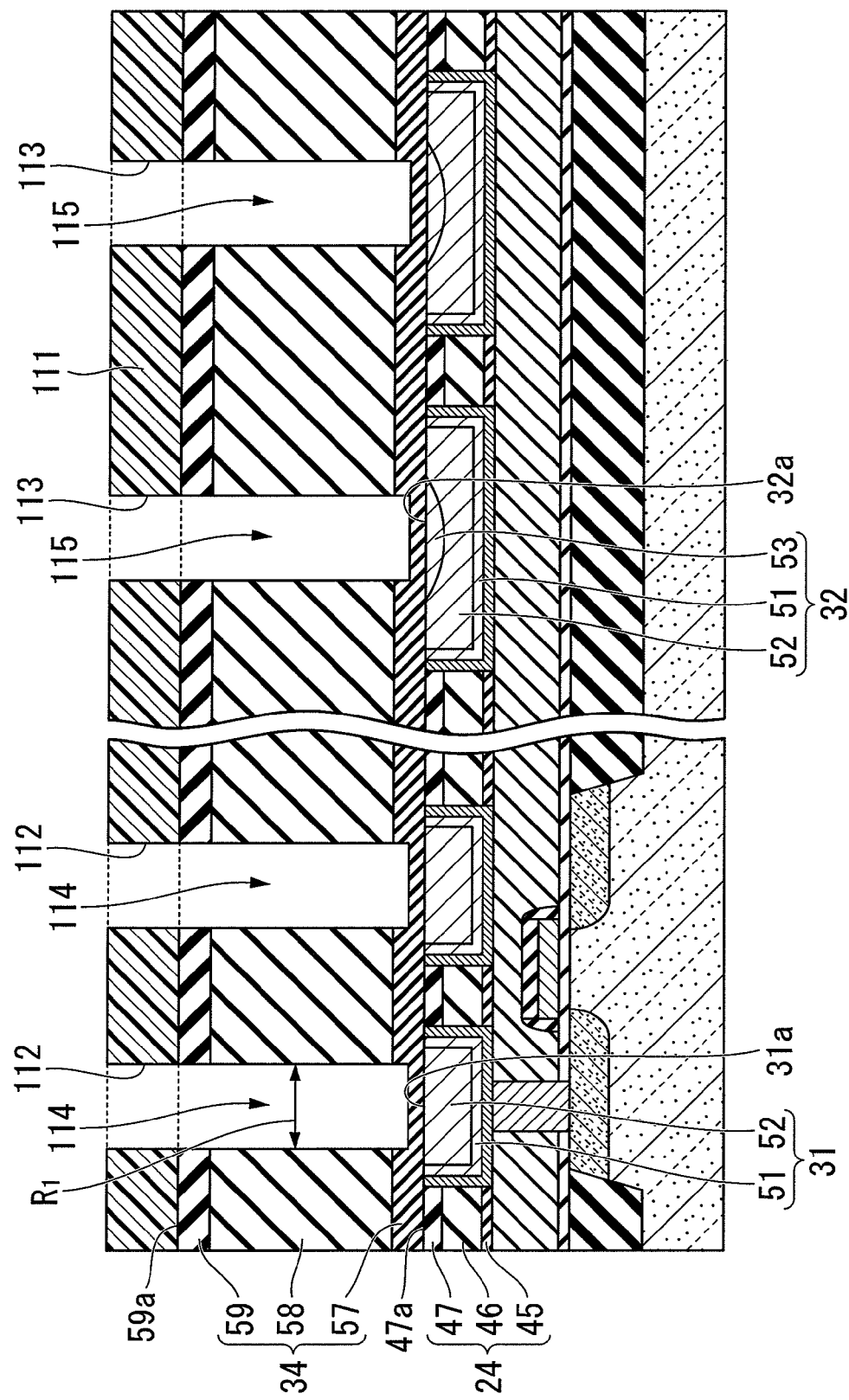

In a process shown in FIG. 12, an anisotropic etching (for example, dry etching) process is carried out with the second etching resist film 111 as a mask to collectively form through holes 114 and 115 under the holes 112 and 113, respectively. The through holes 114 and 115 penetrate through the low dielectric constant insulating film 58 and the protection film 59.

At this time, the etching process is preferably carried out with high selectivity of the low dielectric constant insulating film 58 and the protection film 59 to be etched (i.e., under the condition that the diffusion prevention film 57 is hardly etched).

Under such, a condition, the diffusion prevention film 57 can be used as an etching stopper film, thereby making an etching process time for the low dielectric constant insulating film 58 and the protection film 59 longer. Accordingly, the through holes 114 and 115 can be formed so as to properly penetrate through the low dielectric constant insulating film 58 and the protection film 59.

The etching process is carried out so that the diffusion prevention film 57 remains between the bottom surface of the through hole 114 and the upper surface of the first conductive portion 31 and between the bottom surface of the through hole 115 and the upper surface of the second conductive portion 32.

Thus, the diffusion prevention film 57 remains under the through holes 114 and 115, thereby preventing the first and second conductive portions 31 and 32 being etched by an anisotropic etching process illustrated in FIG. 16 that will be explained later.

The through hole 114 is a hole that will become the through hole 62 shown in FIG. 1 after a portion of the diffusion prevention film 57 under the through hole 114 is removed in a process shown in FIG. 16 that will be explained later. Similarly, the through hole 115 is a hole that will become the through hole 65 shown in FIG. 1 after a portion of the diffusion prevention film 57 under the through hole 115 is removed in a process shown in FIG. 16 that will be explained later. The diameter $R_1$ of the through hole 114 may be, for example, 200 nm.

Figure 13:
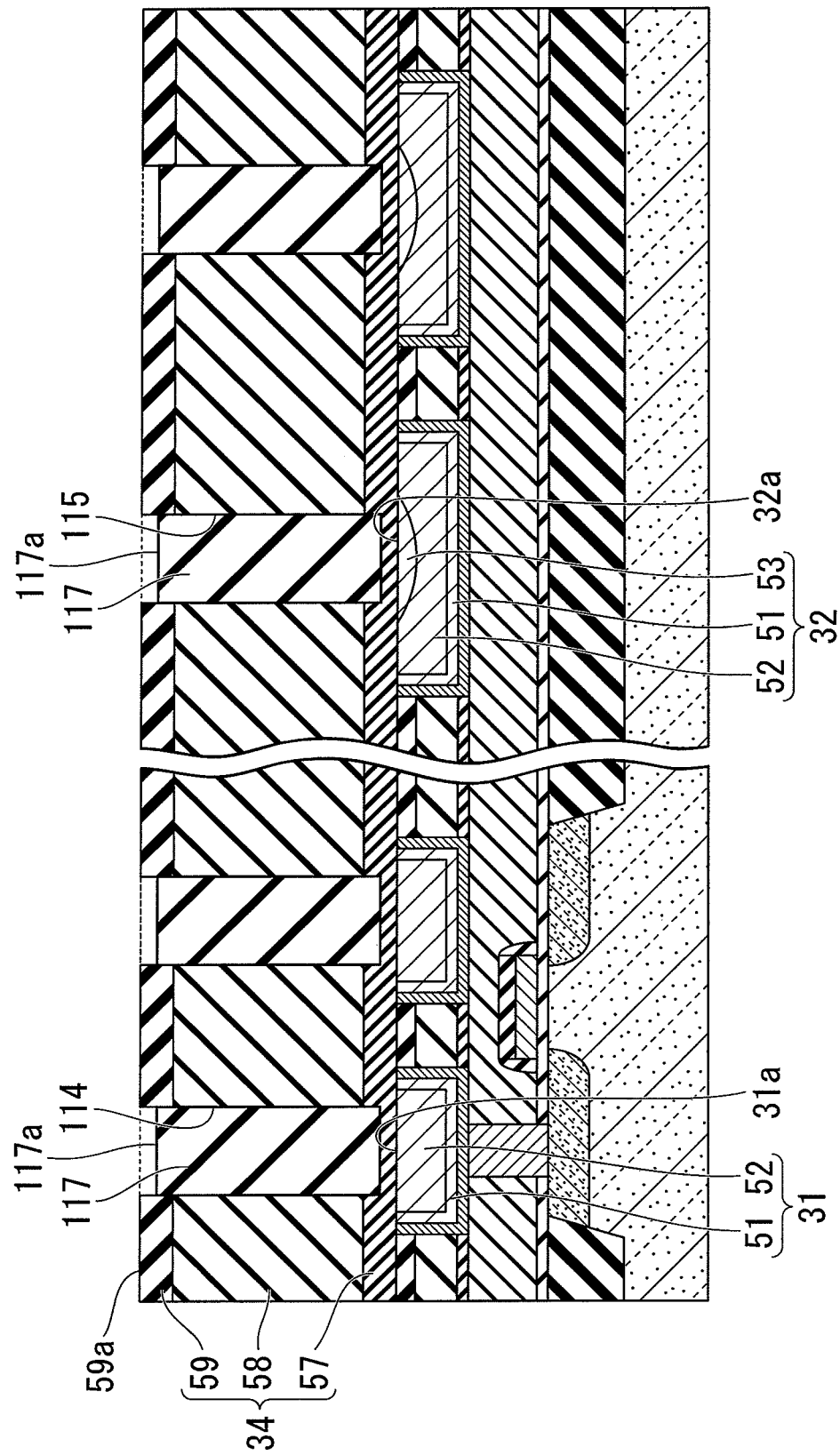

In a process shown in FIG. 13, the second etching resist film 111 shown in FIG. 12 is removed by an aching process, and then an etching protection film 117 is formed in the through holes 114 and 115. The etching protection film 117 is used for preventing portions of the diffusion prevention film 57, which are positioned under the through holes 114 and 115, from being etched by an anisotropic etching process for forming holes 61 and 64 that will become upper portions of the first and second openings 36 and 37. For example, a BARC (Bottom Anti-Reflection Coating) film may be used as the etching protection film 117.

When a BARC film is used as the etching protection film 117, the BARC film is applied over the surface 59a of the protection film 59 after the second etching resist film 111 is removed, so as to fill the through holes 114 and 115. Then, the entire BARC film is etched so that only the portions of the BARC film, which are included in the through holes 114 and 115, remain.

By the etching process, the top surface of the BARC films included in the through holes 114 and 115 becomes lower in level than the upper surface 59a of the protection film 59. Thus, a recessed portion is defined by the upper surface of the BARC film and the side surface of the hole 114 or 115. The depth of the recessed portion is, for example, 50 nm.

Figure 14:
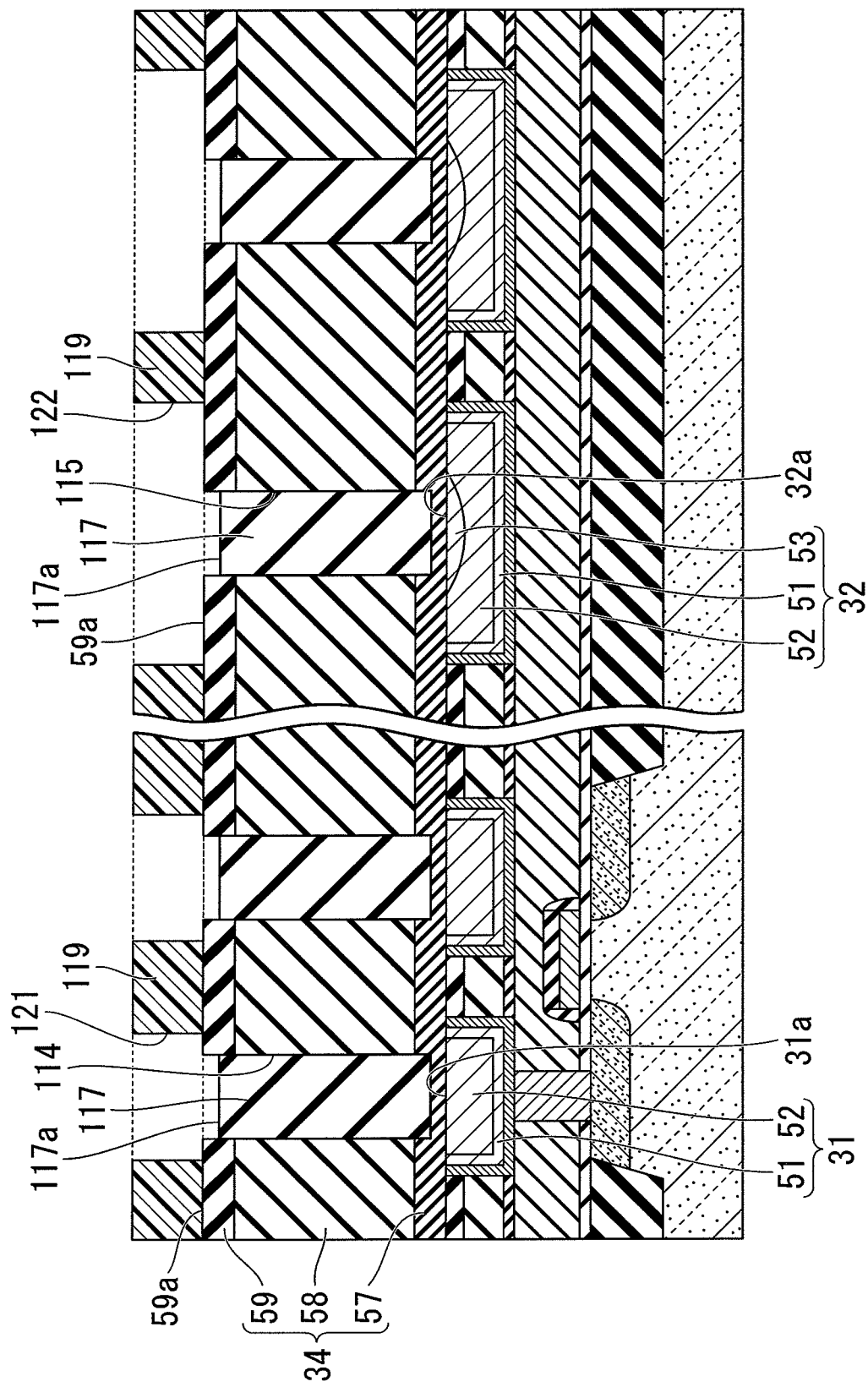

In a process shown in FIG. 14, a third etching resist film 119, which has holes 121 and 122, is formed over the upper surface 59a of the protection film 59. At this time, the hole 121 is formed so as to expose a portion of the surface 59a of the protection film 59 and a portion of the upper surface 117a of the etching protection film 117, the positions of which correspond to the formation region of the hole 61 shown in FIG. 1. Additionally, the hole 122 is formed so as to expose a portion of the surface 59a of the protection film 59 and a portion of the upper surface 117a of the etching protection film 117, the positions of which correspond to the formation region of the hole 64 shown in FIG. 1.

Figure 15:
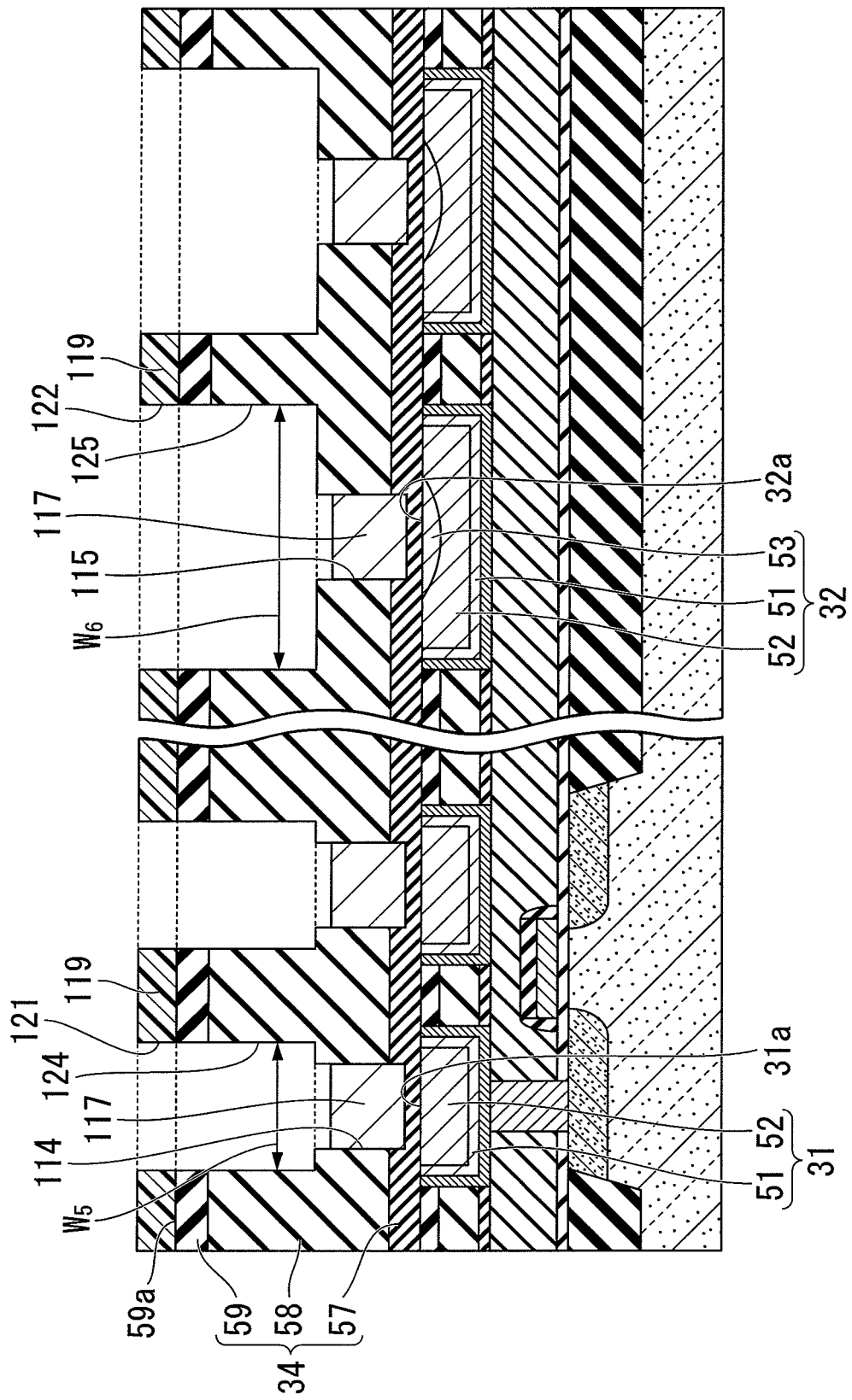

In a process shown in FIG. 15, an anisotropic etching process is carried out with the third etching resist film 119 as a mask to form holes 124 and 125 under the holes 121 and 122, respectively. The holes 124 and 125 penetrate the protection film 59 and part of the low dielectric constant insulating film 58.

The hole 124 becomes part of the hole 61 shown in FIG. 1, and has a depth shallower than that of the hole 61. The hole 125 becomes part of the hole 64 shown in FIG. 1, and has a depth, shallower than the that of the hole 64.

The width $W_5$ of the hole 124 is, for example, 50 nm to 300 nm. The width $W_6$ of the hole 125 is, for example, 500 nm to 3000 nm.

In this case, part of the etching protection film 117 is removed by the etching process for forming the holes 124 and 125. However, the etching protection film 117 remains in the holes 114 and 115 after formation of the holes 124 and 125, the diffusion prevention film 57 under the through holes 114 and 115 is not etched. Further, the protection film 59 shown in FIG. 14 is partially removed by the etching process for forming the holes 124 and 125.

Figure 16:
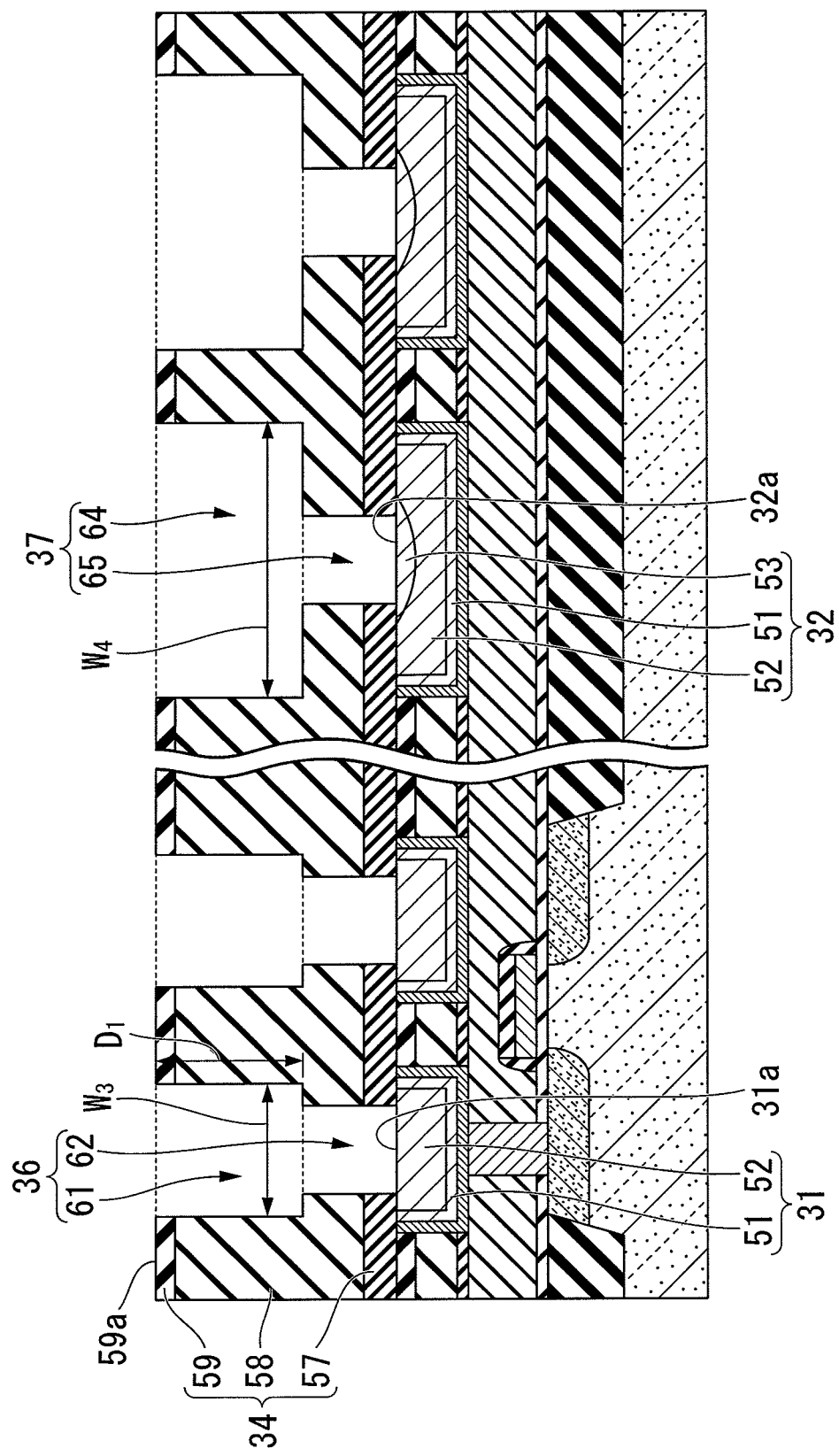

In a process shown in FIG. 16, an anisotropic etching (for example, dry etching) process is carried out to remove portions of the low dielectric insulating film 58 which are positioned under the holes 121 and 122 shown in FIG. 15, and to remove portions of the diffusion prevention film 57 which are positioned under the through holes 114 and 115. Thus, the first openings 36 and 37 are formed. The first opening 36 includes the hole 61 and the through hole 62, and exposes part of the upper surface 31a of the first conductive portion 31. The second opening 37 includes the hole 64 and the through hole 65, and exposes part of the upper surface 32a of the second conductive portion 32.

The width $W_3$ of the hole 61 is substantially the same as the width $W_5$ of the hole 124. The width $W_3$ of the hole 61 is, for example, 50 nm to 300 nm. The depth $D_1$ of the hole 61 is substantially the same as that of the hole 64. The depth $D_1$ of the hole 61 is, for example, 500 nm.

The width $W_4$ of the hole 64 is substantially the same as the width $W_6$ of the hole 124. The width $W_4$ of the hole 61 is, for example, 500 nm to 3000 nm. The depth $D_1$ of the hole 61 is substantially the same as that of the hole 64. The depth $D_1$ of the hole 61 is, for example, 500 nm.

By the anisotropic etching process illustrated in FIG. 16, the third etching resist film 119 and the etching protection film 117, which are shown in FIG. 15, are removed, and the upper portion of the protection film 59 is removed.

The process shown in FIG. 11 for forming the second etching resist film 111 to the process shown in FIG. 16 correspond to the opening formation process (for forming the first and second openings 36 and 37).

Figure 17:
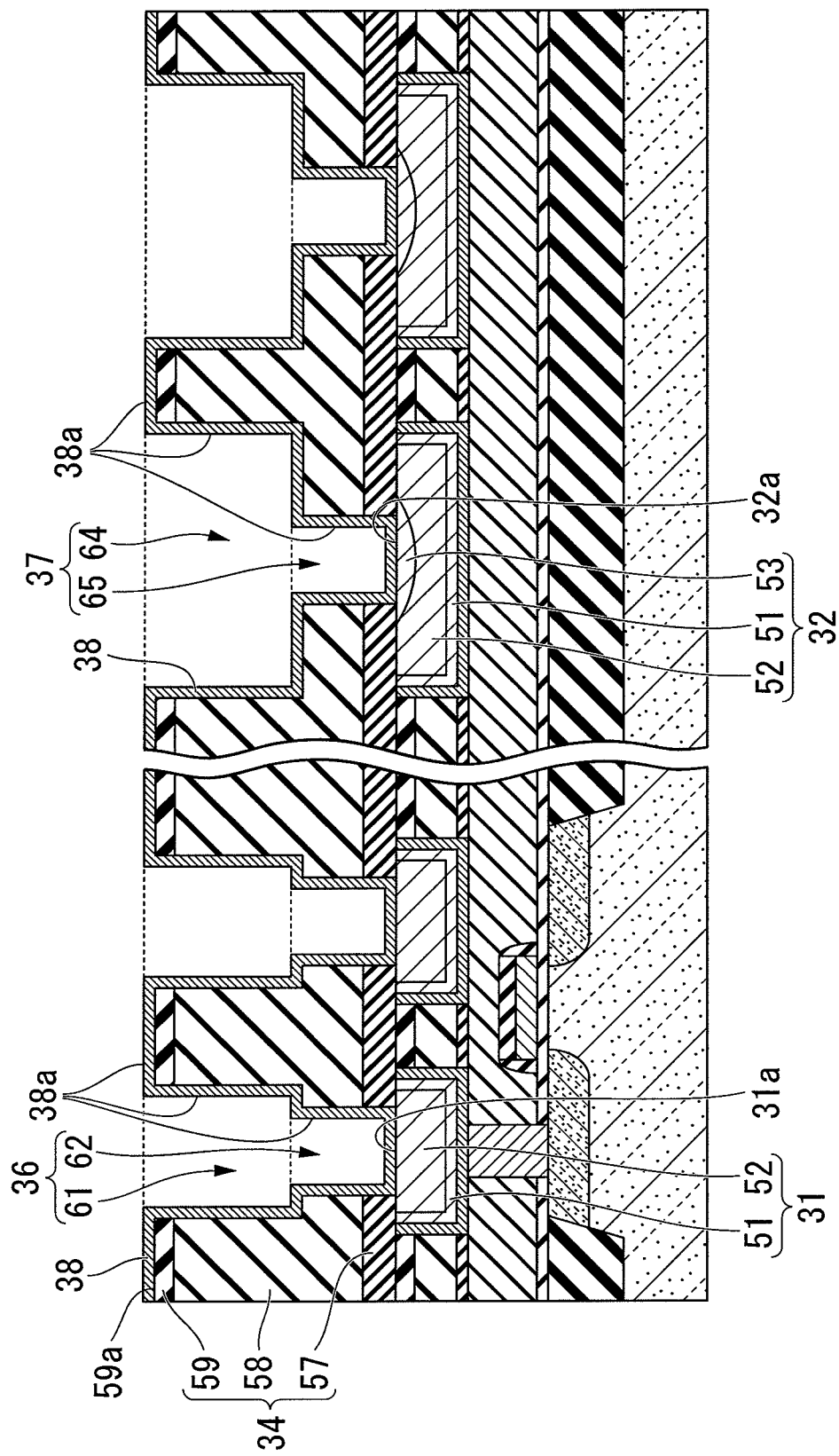

In a process shown in FIG. 17, the second seed layer 38 is formed so as to cover the upper surface 59a of the protection film 59 (corresponding to the upper surface of the second insulating film 34) and inner surfaces of the first and second openings 36 and 37 (seed layer formation process).

Specifically, the second seed layer 38 is formed by a spattering method. As the second seed layer 38, a multi-layered film may be used, which includes, for example, a tantalum (Ta) layer (with a thickness of, for example, 20 nm) and a copper (Cu) layer (with a thickness of, for example, 50 nm) over the tantalum layer.

Figure 18:
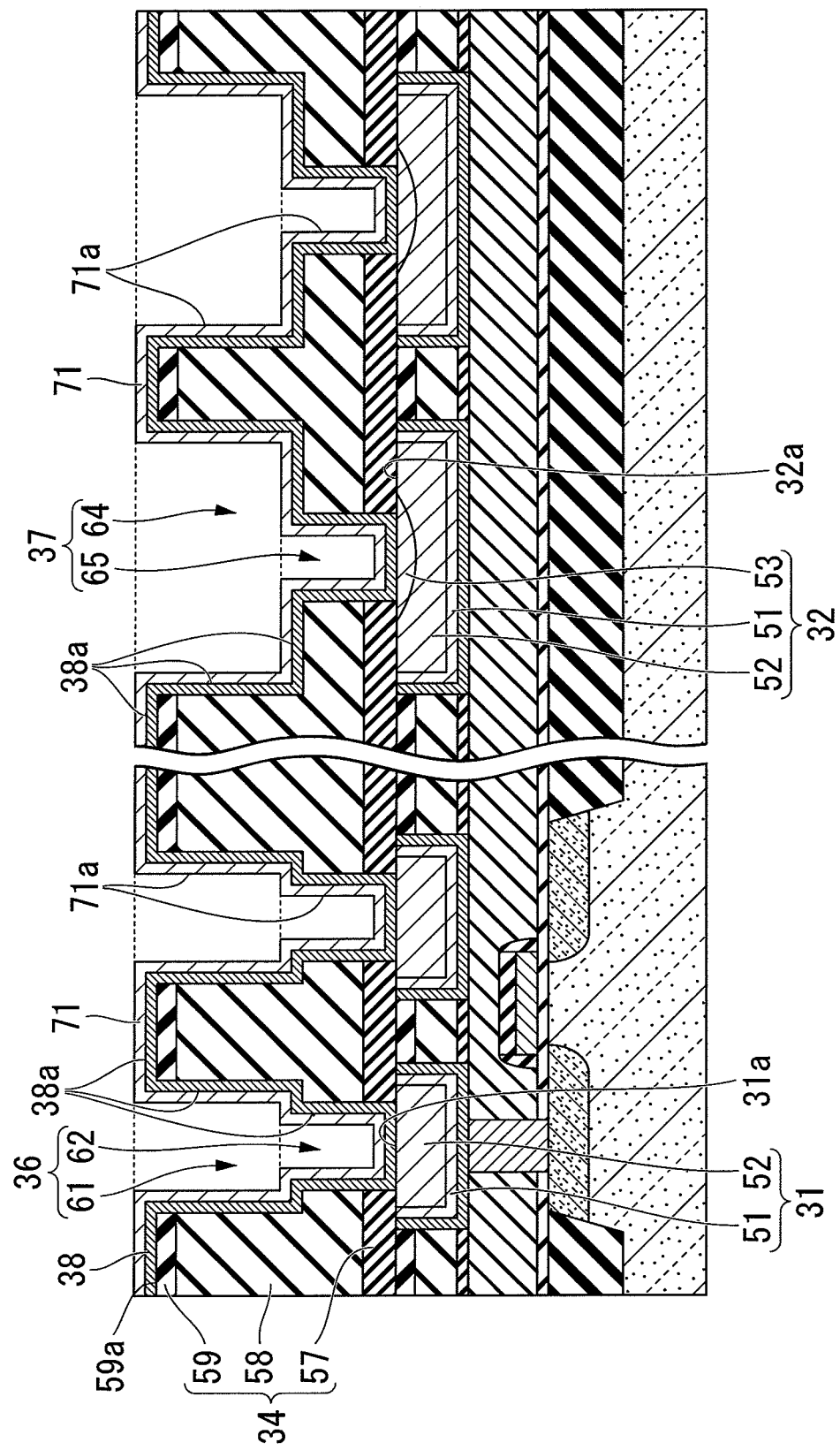

In a process shown in FIG. 18, the first plating film 71 is formed at the first growth rate by an electrolytic plating method using the plating apparatus 90 shown in FIG. 22 (first plating film formation process). The first growth rate is, for example, 2.5 nm/sec to 3.2 nm/sec. The first plating film 71 covers the surface 38a of the second seed layer 38, but not fully fills the first opening 36.

For example, a copper (Cu) film may be used as the first plating film 71. In this case, the structure shown in FIG. 17 is immersed in the Cu plating solution at a temperature of 25° C., which is used as the plating solution 92. Then, the structure shown in FIG. 17 is rotated at a speed of 12 rpm. Then, the first current $I_1$ (a value of which is, for example, 4.5 A) is applied to the second seed layer 38. Then, a plating process is carried out for 5.5 seconds. Thus, the first plating film 71 can be formed. The first plating film 71 is formed such that a thickness of the first plating film 71 on a large flat surface becomes 15 nm.

Thus, the first plating film 71 with a low growth rate is formed over the surface 38a of the second seed layer 38. Thus, thin portions and discontinuous portions of the second seed layer 38 can be covered by the first plating film 71, thereby preventing voids from being included in the second plating film 72 filling up the first opening 36.

Additionally, the first plating film 71 is formed so as not to fully fill the first opening 36. In other words, the thickness of the first plating film 71 is made small. Thereby, a plating process time for the first plating film 71 with a very low growth rate can be reduced.

The value of the first current $I_1$ is not limited to 4.5 A. The plating process time in the first plating film formation process is not limited to the above value. The Cu plating solution used for forming the first plating film 71 may be the same as used in the process shown in FIG. 6.

Figure 19:
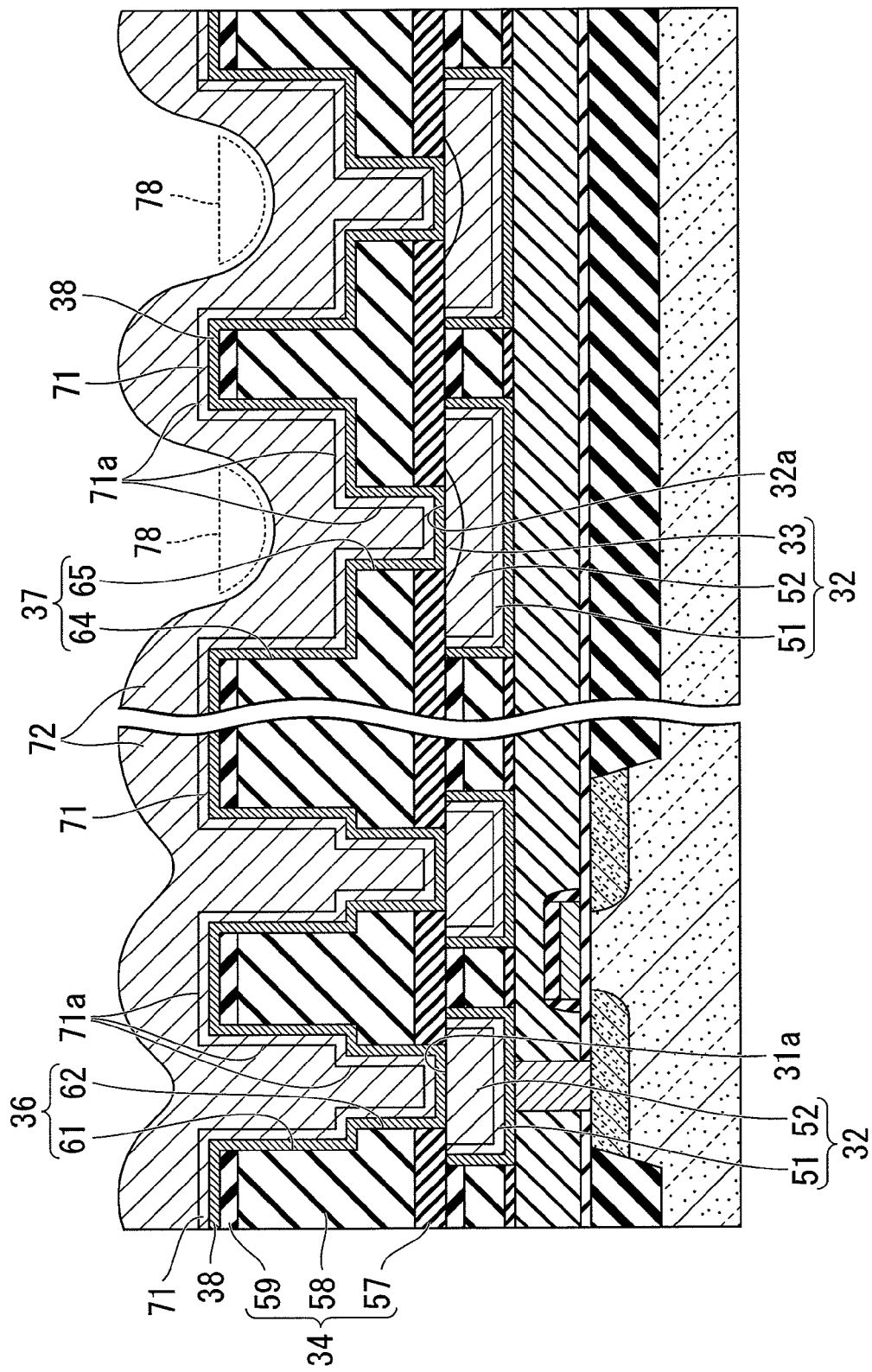

In a process shown in FIG. 19, the second plating film 72 is formed over an upper surface 71a of the first plating film 71 using the plating apparatus 90 shown in FIG. 22, at the second growth rate that is higher than the first growth rate and prevents voids from occurring (second plating film formation process). The second growth rate is, for example, 3.4 nm/sec to 4.5 nm/sec. The second plating film 72 has a thickness such that the first opening 36 is filled up with the second plating film 72. At this time, a recessed portion 78 is formed in the upper surface region of the second plating film 72 (on the side of an upper surface 72a of the second plating film 72) which partially fills the hole 64.

For example, a Cu plating film may be used as the second plating film 72. When a Cu plating film is used as the second plating film 72, for example, the structure shown in. FIG. 18 is immersed in the Cu plating solution at a temperature of 25° C., which is used as the plating solution 92. Then, the structure shown in FIG. 18 is rotated at the speed of 12 rpm. Then, the second current $I_2$ (a value of which is, for example, 6.75 A), which is larger than the first current $I_1$, is applied to the second seed layer 38. A plating process time for the second plating film 72 may be, for example, 60 seconds. Thus, the second plating film 38 can be formed. The second plating film 72 is formed such that a thickness of the second plating film 72 on a large flat surface becomes 210 nm.

Thus, the first opening 36 is filled with the second plating film 72 formed at the second growth rate that is higher than the first growth rate, thereby preventing voids from occurring in the first opening 36 including the narrow hole 61 and the through hole 62.

Since the second growth rate is higher than the first growth rate, the process time for filling the first opening 36 with the second plating film 72 is shorter than that for filling the first opening 36 with only the first plating film 71.

Additionally, in the process shown in FIG. 19 (second plating film formation process), the recessed portion 78 is formed in the upper surface portion of the second plating film 72 in the hole 64. However, the width of the hole 64 is large, and therefore voids are not likely to occur in the hole 64. Accordingly, the recessed portion 78 can be easily filled with the third plating film 73 (with a high growth rate) formed after the second plating film formation process.

The plating solution 92 used for the second plating film formation process may be the same as the Cu plating solution used for the first plating film formation process shown in FIG. 18. Accordingly, the first and second plating films 71 and 72 can be sequentially formed.

The value of the second current $I_2$ is not limited to 6.75 A. The plating process time required for the second plating film formation process is not limited to the above value.

Figure 20:
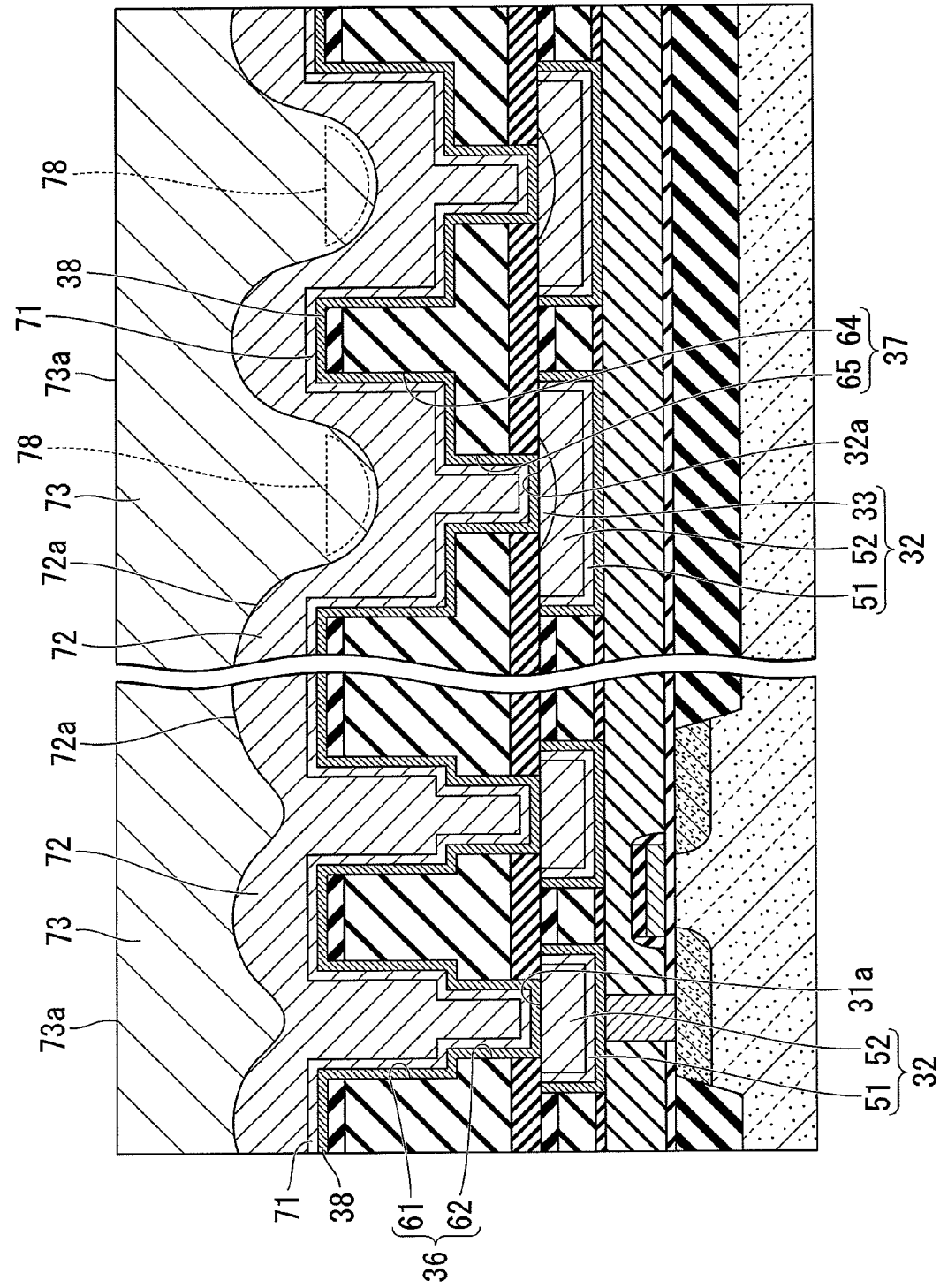

In a process shown in FIG. 20, the third plating film 73 is formed over the surface 72a of the second plating film 72, at the third growth rate that is higher than the second growth rate (third plating film formation process). The third growth rate is, for example, 18 nm/sec to 25 nm/sec. The third plating film 73 fills the recessed portion 78.

For example, a Cu plating film may be used as the third plating film 73. In this case, the structure shown in FIG. 19 is immersed in the Cu plating solution at a temperature of 25° C., which is used as the plating solution 92. Then, the structure shown in FIG. 19 is rotated at the speed of 12 rpm. Then, the third current $I_3$ (a value of which is, for example, 40.5 A), which is larger than the first and second currents $I_1$ and $I_2$, is applied to the second seed layer 38. Then, a plating process is carried out for 30 seconds. Thus, the third plating film 73 can be formed. The third plating film 73 is formed such that a thickness of the third plating film 73 on a large flat surface becomes 630 nm.

Thus, the third plating film 73 is fanned so as to fill the recessed portion 78, thereby preventing dishing from occurring in the plating films filling the second opening 37 during a polishing in a conductive portion formation process that will be explained later.

Additionally, the recessed portion 78 is filled with the third plating film 73 with a higher growth rate than those of the first and second plating films 71 and 72, thereby making the amount of time required for filling the recessed portion 78 with the third plating film 73 shorter than that for filling the recessed portion 78 with only the second plating film 72.

Further, an upper surface 73a of the third plating film 73 is preferably made flat by increasing the thickness of the third plating film 73 in the third plating film formation process. If the upper surface 73a of the third plating film 73 is flat, a polishing of the plating film in the conductive portion formation process (shown in FIG. 21) proceeds at a constant speed, irrespective of the shape and layout of the first and second openings 36 and 37, thereby preventing dishing and erosion from occurring.

Figure 21:
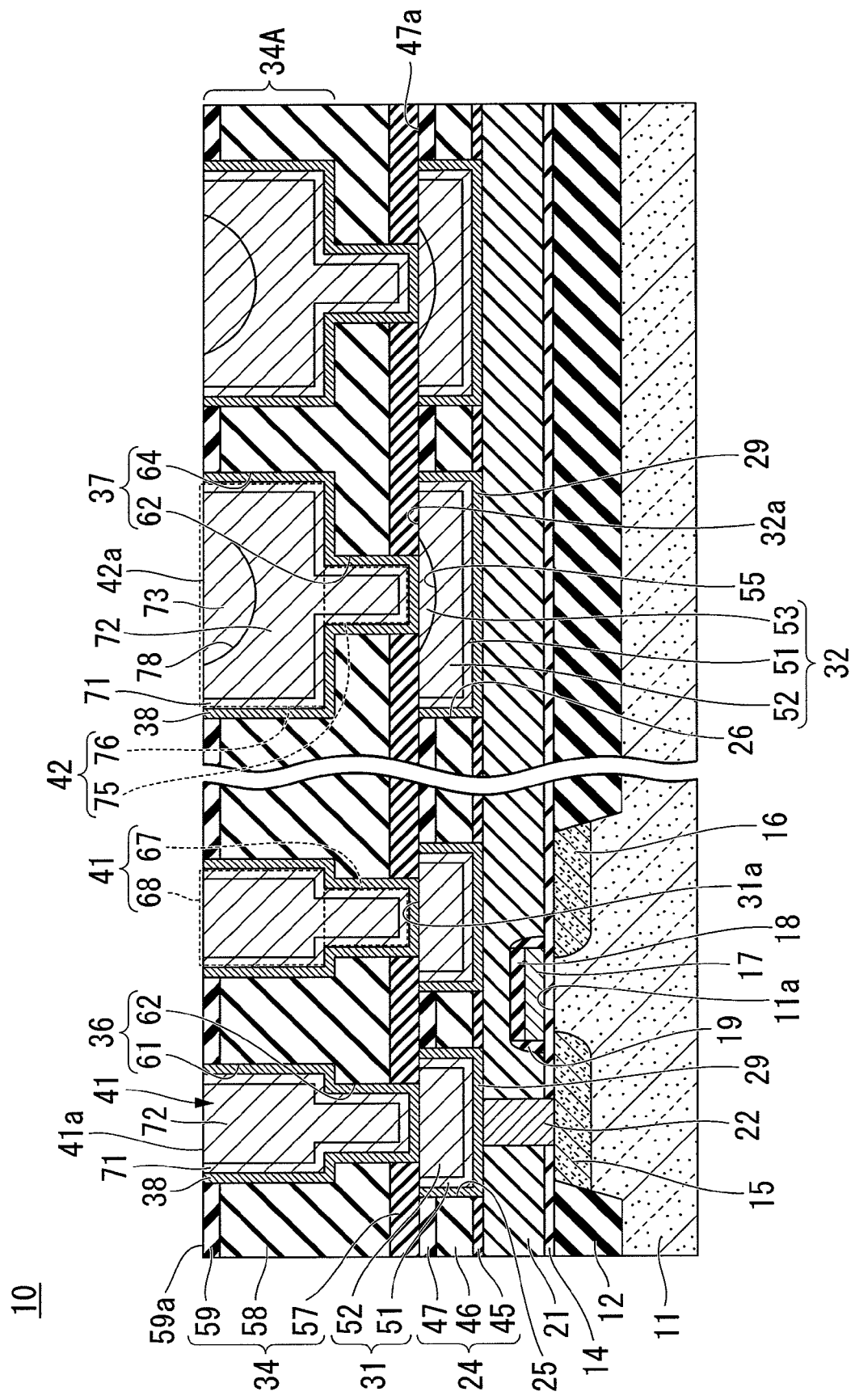

In a process shown in FIG. 21, portions of the second seed layer 38 and the first to third plating films 71 to 73, which are higher in level than the upper surface 59a of the protection film 59, are removed by a polishing process so as to form the first and second conductive portions (dual-damascene wires) 41 and 42 (conductive portion formation process). The first conductive portion 41 includes the first and second plating films 71 and 72, which fill the first opening 36. The second conductive portion 42 includes the first to third plating films 71 to 73, which fill the second opening 37. Specifically, the polishing process is carried out by a CMP (Chemical Mechanical Polishing) method to form the first and second conductive portions 41 and 42.

As explained above, the recessed portion 78 in the second opening 37 is filled with the third plating film. 73, and the upper surface 73a of the third plating film 73 is made flat. Therefore, dishing and erosion due to the polishing in the conductive portion formation process can be prevented. Accordingly, the upper surface 59a of the protection film 59, the upper surface 31a of the first conductive portion 31, and the upper surface 32a of the second conductive portion 32 have the same level after the polishing. Thus, the semiconductor device 10 shown in FIG. 1 can be manufactured.

According to the method of manufacturing a semiconductor device of the first embodiment, the first plating film 52, which covers the surface 29a of the first seed layer 29, is formed at the first growth rate that is lower than the second and third growth rates. Thus, thin portions and discontinuous portions of the first seed layer 29 are covered by the first plating film 52, thereby preventing voids from being included in the second plating film 52 filling up the first opening 25.

Additionally, the second plating film 52, which covers the surface 52a of the first plating film 52, is formed at the second growth rate that is higher than the first growth rate and prevents voids from occurring. Thereby, voids can be prevented from being included in the second plating film 52 filling the first opening 25. Further, a time required for filling the first opening 25 with the second plating film 52 can be made shorter than that required for filling the first opening 25 with only the first plating film 52.

Further, the third plating film 53 is formed over the second plating film 52 at the third growth rate that is higher than the second growth rate. Thus, the second opening 26, which has a larger width than that of the first opening 25, can be filled by a plating process with a short processing time. Additionally, dishing and erosion can be prevented when the first seed layer 29 and the first to third plating films 51 to 53 are polished.

Moreover, the first opening 36, in which the dual-damascene wire is formed, is filled with the first and second plating films 71 and 72, thereby preventing voids from occurring in the first opening 36. Additionally, the second opening 37, in which the dual-damascene wire is formed, is filled with the first to third plating films 71 to 73, thereby preventing dishing and erosion from occurring in the second opening 37.

The present invention is applicable to a semiconductor device manufacturing method.

As used herein, the following directional terms "forward," "rearward," "above," "downward," "vertical," "horizontal," "below," and "transverse," as well as any other similar directional, terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

What is claimed is:

1. A method of manufacturing a semiconductor device, comprising:
    forming a first hole in an insulating film;
    forming a seed layer covering an upper surface of the insulating film and an inner surface of the first hole;
    forming a first plating film over the seed layer at a first growth rate;
    forming a second plating film over the first plating film at a second growth rate that is higher than the first growth rate;
    forming a third plating film over the second plating film at a third growth rate that is higher than the second growth rate; and
    removing portions of the seed layer and the first to third plating films, which are positioned higher in level than the upper surface of the insulating film.

2. The method according to claim 1, wherein
    the second plating film has a first portion in the first hole, and
    the lowest level of an upper surface of the first portion is lower than the level of the upper surface of the insulating film.

3. The method according to claim 1, wherein forming the third plating film comprises forming the third plating flint having a substantially flat upper surface that is higher in level than the top level of the second plating film.

4. The method according to claim 1, wherein forming the second plating film comprising forming the second plating film that is larger in thickness than the first plating film.

5. The method according to claim 1, wherein the first to third plating films are formed using the same plating apparatus and the same plating solution.

6. The method according to claim 1, wherein
    forming the first plating film comprises applying a first amount of current to the seed layer,
    forming the second plating film comprises applying, to the seed layer, a second amount of current that is larger than the first amount of current, and
    forming the third plating film comprises applying, to the seed layer, a third amount of current that is larger than the second amount of current.

7. The method according to claim 6, wherein applying the first amount of current, applying the second amount of current, applying the third amount of current are performed while the semiconductor device is rotated at a predetermined speed.

8. The method according to claim 1, further comprising:
    forming a second hole in the insulating film, the second hole being separated from the first hole, and the second hole being smaller in horizontal dimension than the first hole,
    wherein the seed layer covers the upper surface of the insulating film and inner surfaces of the first and second holes, and
    the second plating film fills up the second hole.

9. The method according to claim 1, further comprising:
    forming a second hole in the insulating film, the second hole being positioned under the first hole, the second hole being smaller in horizontal dimension than the first hole, and the second hole being connected to the first hole,
    wherein the seed layer covers the upper surface of the insulating film and inner surfaces of the first and second holes, and
    the second plating film fills up the second hole.

10. A method of manufacturing a semiconductor device, comprising:
    forming a first hole in an insulating film;
    forming a seed layer covering an upper surface of the insulating film and an inner surface of the first hole;
    applying a first amount of current to the seed layer to form a first plating film over the seed layer;
    applying a second amount of current to the seed layer to form a second plating film over the first plating film, the second amount being larger than the first amount;
    applying a third amount of current to the seed layer to form a third plating film over the second plating film, the third amount being larger than the second amount; and
    removing portions of the seed layer and the first to third plating films, which are positioned higher in level than the upper surface of the insulating film.

11. The method according to claim 10, wherein the third plating film has a substantially flat upper surface that is higher in level than the top level of the second plating film.

12. The method according to claim 10, wherein
    applying the first amount of current is performed for a first period of time,
    applying the second amount of current is performed for a second period of time,
    applying the third amount of current is performed for a third period of time, and
    the first period of time is smaller than the second and third periods of time.

13. The method according to claim 10, wherein applying the first amount of current, applying the second amount of current, applying the third amount of current are performed while the semiconductor device is rotated at a predetermined speed.

14. The method according to claim 10, wherein
    the second plating film has a first portion in the first hole, and
    the lowest level of an upper surface of the first portion is lower than the level of the upper surface of the insulating film.

15. A method of manufacturing a semiconductor device, comprising:
    forming a first hole in an insulating film;
    forming a second hole in the insulating film, the second hole being separated from the first hole by the insulating film, the second hole being larger in horizontal dimension than the first hole;
    forming a seed layer covering an upper surface of the insulating film and inner surfaces if the first and second holes;
    forming a first plating film over the seed layer;
    forming a second plating film over the first plating film, the second plating film filling up the first hole, the second plating film having a first portion in the second hole, and the lowest level of an upper surface of the first portion being lower than the level of the upper surface of the insulating film; and
    forming a third plating film over the second plating film, the third plating film filling up the second hole.

16. The method according to claim 15, wherein forming the third plating film comprises forming the third plating film having a substantially flat upper surface that is higher in level than the top level of the second plating film.

17. The method according to claim 16, further comprising:
removing portions of the seed layer and the first to third plating films, which are positioned higher in level than the upper surface of the insulating film.

18. The method according to claim 15, wherein
forming the first plating film is performed at a first growth rate,
forming the second plating film is performed at a second growth rate that is higher than the first growth rate, and
forming the third plating film is performed at a third growth rate that is higher than the second growth rate.

* * * * *

UNITED STATES PATENT AND TRADEMARK OFFICE
CERTIFICATE OF CORRECTION

PATENT NO. : 8,853,074 B2  
APPLICATION NO. : 13/069754  
DATED : October 7, 2014  
INVENTOR(S) : Tatsuya Miyazaki Page 1 of 1

It is certified that error appears in the above-identified patent and that said Letters Patent is hereby corrected as shown below:

In the Claims

Column 22, line 55, should read "insulating film and inner surfaces of the first and second".

Signed and Sealed this  
Third Day of February, 2015

Michelle K. Lee  
*Deputy Director of the United States Patent and Trademark Office*